US008701864B2

(12) United States Patent
Ogawa et al.

(10) Patent No.: US 8,701,864 B2
(45) Date of Patent: Apr. 22, 2014

(54) ARTICLE TRANSPORT FACILITY

(71) Applicant: Daifuku Co., Ltd., Osaka (JP)

(72) Inventors: Daisuke Ogawa, Komaki (JP); Suguru Shibata, Komaki (JP); Atsushi Otani, Gamo-gun (JP); Tomotaka Kinugawa, Gamo-gun (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 13/680,384

(22) Filed: Nov. 19, 2012

(65) Prior Publication Data

US 2013/0313070 A1 Nov. 28, 2013

(30) Foreign Application Priority Data

Nov. 24, 2011 (JP) ................. 2011-256593

(51) Int. Cl.
*B66B 3/00* (2006.01)
(52) U.S. Cl.
CPC ........................ *B66B 3/00* (2013.01)
USPC .................. 198/370.1; 198/465.4; 198/369.1; 104/91; 104/94
(58) Field of Classification Search
USPC .............. 198/370.01, 352, 465.4, 580, 601, 198/369.1; 104/89, 91–95
See application file for complete search history.

(56) References Cited

U.S. PATENT DOCUMENTS

| | | | | |
|---|---|---|---|---|
| 4,326,624 A | * | 4/1982 | Ewertowski et al. | ......... 198/364 |
| 5,062,524 A | * | 11/1991 | Nozaki et al. | ............. 198/465.4 |
| 5,388,703 A | * | 2/1995 | Schonenberger et al. | ... 209/44.1 |
| 6,321,138 B1 | * | 11/2001 | Livesay et al. | ................ 700/245 |
| 6,478,134 B2 | * | 11/2002 | Pattantyus-Abraham et al. | ........................... 198/339.1 |
| 6,799,521 B2 | * | 10/2004 | Tai et al. | ..................... 104/88.01 |
| 6,920,973 B2 | * | 7/2005 | Koren et al. | ................ 198/339.1 |
| 8,231,324 B2 | * | 7/2012 | Yoshida et al. | ............... 414/280 |
| 2004/0173438 A1 | * | 9/2004 | Ursitti | ........................ 198/465.4 |
| 2005/0150416 A1 | * | 7/2005 | Hori et al. | ........................ 105/49 |
| 2006/0051188 A1 | * | 3/2006 | Hoshino | ....................... 414/277 |
| 2006/0222479 A1 | | 10/2006 | Shiwaku et al. | |
| 2010/0242784 A1 | * | 9/2010 | Oguro et al. | ............. 104/130.01 |

FOREIGN PATENT DOCUMENTS

| | | |
|---|---|---|
| JP | 2006241685 A | 9/2006 |
| JP | 2006282303 A | 10/2006 |

* cited by examiner

*Primary Examiner* — Mark A Deuble

(74) *Attorney, Agent, or Firm* — The Webb Law Firm

(57) ABSTRACT

A travel guide member which forms travel paths for an article transport vehicle is provided on a ceiling side. The travel guide member defines a plurality of travel paths along which the article transport vehicle travels in the same direction such that the travel paths are spaced apart from each other in a path lateral direction and defines a first diverging path and a second diverging path for connecting with each other a first travel path that is one of a pair of adjacent travel paths among the plurality of the travel paths and a second travel path that is the other of the pair of the adjacent travel paths. The first diverging path and the second diverging path are formed such that both extend in directions that are slanted with respect to the travel path in plan view and such that they intersect each other in plan view.

8 Claims, 23 Drawing Sheets

ARTICLE TRANSPORT FACILITY

FIELD OF THE INVENTION

The present invention relates to an article transport facility in which a travel guide member is provided on a ceiling side for defining travel paths for an article transport vehicle and in which the travel guide member defines a plurality of the travel paths along which the article transport vehicle travels in the same direction such that the travel paths are spaced apart from each other in a path lateral direction, and defines a first diverging path and a second diverging path for connecting, with each other, a first travel path that is one of a pair of adjacent travel paths among the plurality of the travel paths and a second travel path that is the other of the pair of the adjacent travel paths.

BACKGROUND

Article transport facilities such as one described above are installed, for example, in a ceiling area in a clean room, and are used to transport, as articles, containers for housing substrates, such as silicon substrates.

More specifically, for example, one of a plurality of travel paths is installed so as to extend by way of or along carry-in-and-out-portions of a plurality of substrate processing devices which perform different kinds of processes on the substrates. And article transport vehicles transport the articles to the plurality of substrate processing devices. And even if an article transport vehicle traveling along one travel path has stopped at a location corresponding to a carry-in-and-out portion of a substrate processing device, another article transport vehicle that was following the stopped article transport vehicle can travel past the stopped article transport vehicle by traveling along another travel path. Subsequently, the article transport vehicle that has travelled past the stopped article transport vehicle can transport its article by diverging from the another travel path and traveling into the one travel path that extends by way of the carry-in-and-out portions of the plurality of substrate processing devices.

Incidentally, each article transport vehicle has an article grip portion which can be moved vertically. And the article grip portion is vertically moved with the article transport vehicle stopped at a location corresponding to the carry-in-and-out portion of a substrate processing device when transferring an article to or from the carry-in-and-out portion of the substrate processing device.

An example of such article transport facility is disclosed in JP Publication Of Application No. 2006-282303 (Patent Document 1). In this article transport facility, the first diverging path and the second diverging path are provided at different locations in the longitudinal direction of a pair of adjacent travel paths in plan view.

Incidentally, in this Patent Document 1, an example is described in which one of the pair of adjacent travel paths is provided to extend by way of the carry-in-and-out portions of two substrate processing devices. Referring to this one of the pair as the first travel path, the example in Patent Document 1 is one in which the first diverging path that allows the article transport vehicle to diverge from this first travel path and travel into the second travel path, which is the other of the pair of the travel paths, is provided at a location that corresponds to a position between the two substrate processing devices that are adjacent to each other. And the second diverging path that allows the article transport vehicle to diverge from the second travel path and travel into the first travel path is located upstream of the substrate processing device that is located upstream of the other of the two adjacent substrate processing devices.

Because the first diverging path and the second diverging path are provided at different locations in the longitudinal direction of the pair of the adjacent travel paths in plan view in the article transport facility of Patent Document 1, there is a disadvantage that the facility designing work, in which the arrangement of the facility is finalized while determining the locations at which the first diverging path and the second diverging path should be installed, is complicated, in addition to a disadvantage that it is difficult to improve article transporting efficiency; thus there is a desire for improvements.

More specifically, it is necessary to design and set the installing locations of the first diverging path and the second diverging path that would allow the possible travel routes to be secured along which the article transport can be performed as efficiently as possible while taking into consideration various possible travel routes from article transport origins to article transport destinations. During this process, the work involved in determining the installing locations of the first diverging path and the second diverging path while taking various possible travel routes into consideration is done by comparing the case in which the first diverging path is installed with the case in which the second diverging path is installed at each location of the pair of travel paths; thus, the work was time consuming and painstaking. Thus, there was a disadvantage that the facility designing work was complicated.

In addition, in specific sections of the pair of travel paths, the travel distance may be shortened and thus the article transport efficiency may be improved by allowing both a diverging travel from the first travel path into the second travel path and a diverging travel from the second travel path to the first travel path to take place. Even in such a case, if the specific section is too short, it is difficult to improve the article transporting efficiency because only one of the first diverging path and the second diverging path can be provided.

Incidentally, the first diverging path and the second diverging path can be provided in one specific section if the specific section has sufficient length to accommodate the first diverging path and the second diverging path one after the other. However, because the travel speeds of the article transport vehicles need to be reduced at diverging locations and converging locations for safety reasons, etc., as the number of installing locations of the first diverging paths and the second diverging paths increases, the number of sections in which the article transport vehicles have to travel at low speeds increases. As a result, even when the first diverging path and the second diverging path can be provided in one specific section, it is difficult to improve article transporting efficiency.

SUMMARY OF THE INVENTION

In light of the state of the art described above, an article transport facility is desired in which facility designing work involving determination of the arrangement of the facility can be simplified and in which article transporting efficiency can be improved.

An article transport facility in accordance with the present invention comprises:

a travel guide member provided on a ceiling side for defining travel paths for an article transport vehicle;

wherein the travel guide member defines a plurality of the travel paths along which the article transport vehicle travels in the same direction such that the travel paths are spaced apart from each other in a path lateral direction, and defines a first diverging path and a second diverging path for connecting with each other a first travel path that is one of a pair of adjacent travel paths among the plurality of travel paths and a second travel path that is the other of the pair of the adjacent travel paths, wherein the first diverging path is a diverging path by means of which the article transport vehicle diverges from the first travel path and travels into the second travel path, wherein the second diverging path is a diverging path by means of which the article transport vehicle diverges from the second travel path and travels into the first travel path, and wherein the first diverging path and the second diverging path are formed such that the first diverging path and the second diverging path extend in directions that are slanted with respect to the first travel path and the second travel path in plan view and such that the first diverging path and the second diverging path intersect each other in plan view.

As such, since the first diverging path and the second diverging path are formed such that they intersect each other in plan view, the first diverging path and the second diverging path can be provided to the pair of travel paths at the same location.

Thus, when designing and setting the installing locations of the first diverging path and the second diverging path that would allow the possible travel routes to be secured along which the article transport can be performed as efficiently as possible while taking into consideration various possible travel routes from article transport origins to article transport destinations, it is possible to extract locations at which the diverging paths need to be installed in order to secure the possible travel routes that allows the articles to be transported as efficiently as possible, while assuming that the first diverging path and the second diverging path are installed at the same time at each location of the pair of travel paths. As a result, the work involved in determining the installation locations of the first diverging path and the second diverging path while taking various possible travel routes into consideration is made easier; thus, facility designing work can be simplified.

Moreover, since the first diverging path and the second diverging path can be provided to the pair of travel paths at the same location in the travel direction, the first diverging path and the second diverging path can be provided together at locations where it is better to allow for both a diverging travel from the first travel path into the second travel path and a diverging travel from the second travel path into the first travel path for the purpose of shortening the transporting distance. Thus, article transporting efficiency can be improved through shortening of the transporting distances.

Incidentally, since the first diverging path and the second diverging path are provided to the pair of travel paths at the same location, the number of sections in which the article transport vehicle needs to travel at low speeds to diverge away from a path and converge into another path can be reduced compared with the case where the same number of first diverging paths and the second diverging paths are provided at different locations in the longitudinal direction of the pair of travel paths. As a result, lowering of article transporting efficiency can be prevented even when the travel speeds of the article transport vehicles are reduced at diverging locations and converging locations for safety and other reasons.

In short, the configuration described makes it possible to provide an article transport facility in which the facility designing work for designing the facility can be simplified while improving the article transporting efficiency.

Examples of preferable embodiments of the present invention are described next.

In an embodiment of the article transport facility in accordance with the present invention, the plurality of the travel paths preferably form a nested loop with one loop within another in plan view.

Thus, the first diverging path and the second diverging path are formed between a pair of looped travel paths that are among the plurality of travel paths and that are adjacent each other with one within the other such that the first diverging path and the second diverging path intersect each other in plan view. Accordingly, by using one of the pair of the travel paths (for example, second travel path) as a travel path for continuous traveling along which the article transport vehicle is allowed or caused to travel continuously and by using the other of the pair of the travel paths (for example, first travel path) as a travel path for article transfer along which the article transport vehicle is allowed or caused to stop at article transfer locations for an article transfer, the article transport vehicle which has been traveling along the travel path for continuous traveling can be allowed to diverge into and travel along the travel path for article transfer to transfer an article. In addition, the article transport vehicle that has completed the article transfer can be diverged into the travel path for continuous traveling for further traveling. This allows a plurality of article transport vehicles to travel smoothly.

Incidentally, since a plurality of article transfer locations are usually provided in the travel path for article transfer, by installing the first diverging paths and the second diverging paths at a plurality of locations that correspond to the article transfer locations, even if there is an article transport vehicle that is stopped for article transfer in the travel path for article transfer, an article transport vehicle traveling along the travel path for continuous traveling can be allowed to diverge to its target article transfer location by allowing it to travel past the article transport vehicle stopped for article transfer. In addition, an article transport vehicle that has completed an article transfer can be advantageously allowed to diverge into the travel path for continuous traveling by allowing it to travel past the article transport vehicle stopped for article transfer.

In short, the configuration described above makes it possible to provide an article transport facility in which a plurality of article transport vehicles can travel smoothly.

In an embodiment of the article transport facility in accordance with the present invention, the article transport facility preferably further comprises:

the article transport vehicle including a travel portion and an article holding portion located below the travel portion, wherein the travel portion is provided with right and left travel wheels and right and left guide wheels which are rotated about vertical axes;

wherein the travel guide member preferably includes a pair of right and left rail portions, that are spaced apart from each other in the path lateral direction, for each of the first travel path and the second travel path, wherein the pair of right and left rail portions preferably include travel surfaces on which the travel wheels travel and guide surfaces for guiding the guide wheels, a diverging-side rail portion of the pair of right and left rail portions that is located on a side in which the first diverging path and the second diverging path exist is preferably formed such as to extend along an entrance-side portion and an exit-side portion of the first diverging path or the second diverging path in a diverging path forming area between an entrance portion of the first diverging path or the second diverging path and an exit portion of the second diverging path or the first diverging path, and is also preferably formed such as to be discontinuous in an intersecting area of the first diverging path and the second diverging path;

a travel direction change mechanism for switching a travel state of the article transport vehicle between a diverging travel state in which the article transport vehicle traveling along the first travel path or the second travel path is caused to diverge into the first diverging path or into the second diverging path and a non-diverging travel state in which the article transport vehicle is caused to travel straight forward;

a non-diverging travel auxiliary guiding mechanism for guiding the article transport vehicle to limit the article transport vehicle, that is traveling in the diverging path forming area of the first travel path or the second travel path, from leaning toward a side of the diverging-side rail portion;

an auxiliary support mechanism for receiving and supporting the article transport vehicle in an area in which the diverging-side rail portion does not exit in the first diverging path or the second diverging path; and a diverging travel auxiliary guiding mechanism for guiding the article transport vehicle to limit the article transport vehicle traveling along the first diverging path or the second diverging path from leaning in a lateral direction.

That is, in a configuration in which the travel portion of an article transport vehicle travels while guided by the guide rail provided along a travel path, the guide rail includes a pair of right and left rail portions which are spaced apart from each other in the rail lateral direction. Thus, the article transport vehicle is allowed to travel along the guide rail while using the space between the pair of right and left rail portions as the space for a support by means of which an article holding portion is suspended from and supported by the travel portion or as the space through which an upper part of the article holding portion extends.

The position of the travel portion with respect to the guide rail is restricted to the proper position by virtue of the fact that the right and left travel wheels provided to the travel portion travel on the travel surfaces of the pair of right and left rail portions, and the fact that the right and left guide wheels provided to the travel portion are guided by the guide surfaces of the pair of right and left rail portions. Thus, the article transport vehicle is caused to appropriately travel along the guide rail.

The diverging-side rail portion (of the pair of right and left rail portions that define the first travel path or the second travel path) that is located on a side in which the first diverging path and the second diverging path exist is formed such as to extend along the entrance-side portion and the exit-side portion of the first diverging path or the second diverging path in the diverging path forming area between the entrance portion of the first diverging path or the second diverging path and the exit portion of the second diverging path or the first diverging path. Thus, when the article transport vehicle is caused to diverge into and travel along the first diverging path or the second diverging path, one of the right and left travel wheels of the travel portion can travel on the travel surface of the diverging-side rail portion.

Incidentally, since the diverging-side rail portion is discontinuous in the intersecting area of the first diverging path and the second diverging path, the article transport vehicle is allowed to travel along the first diverging path or the second diverging path using the space formed at the discontinuity as the space for the support by means of which an article holding portion is suspended from and supported by the travel portion or as the space through which the upper part of the article holding portion extends.

And since the travel direction change mechanism is provided to switch between the diverging travel state in which the article transport vehicle is caused to diverge toward and into the first diverging path or the second diverging path and the non-diverging travel state in which the article transport vehicle is caused to travel straight forward, the article transport vehicle traveling along the first travel path or the second travel path can be switched between the non-diverging travel state in which the article transport vehicle is caused to continue to travel along the first travel path or the second travel path and the diverging travel state in which the article transport vehicle is caused to travel toward and into the first diverging path or the second diverging path.

A diverging-side rail portion does not exist in the diverging path forming area in the first travel path or the second travel path although there is a rail portion on the side that is away from the first diverging path or the second diverging path in the diverging path forming area. To this end, the configuration described above can limit the article transport vehicle traveling along the first travel path or the second travel path from leaning toward the side of the diverging-side rail portion through the guiding action of the non-diverging travel auxiliary guiding mechanism.

When the article transport vehicle is caused to travel along the first diverging path or the second diverging path, one of the right and left travel wheels of the travel portion can travel on the travel surface of the diverging-side rail portion in the area in which the diverging-side rail portion exists; however, the right and left travel wheels of the travel portion cannot be received and supported in the area in which the diverging-side rail portion does not exist. To this end, with the configuration described above, the article transport vehicle can be received and supported by the auxiliary support mechanism.

When the article transport vehicle is caused to travel along the first diverging path or the second diverging path, one of the right and left travel wheels of the travel portion can travel on the travel surface of the diverging-side rail portion in the area in which the diverging-side rail portion exists; however, one of the right and left travel wheels of the travel portion that is not traveling on the diverging-side rail portion is afloat (i.e. not in contact with any rail portion). To this end, the configuration described above can limit the article transport vehicle traveling along the first travel path or the second travel path from leaning toward the side in which the floating wheel exists through the guiding action of the diverging travel auxiliary guiding mechanism. That is, the article transport vehicle can travel along the first diverging path or the second diverging path while the article transport vehicle is limited from leaning in the lateral direction.

Thus, with the configuration described above and in the configuration in which the diverging-side rail portion of the pair of right and left rail portions is formed to extend along the entrance-side portion and the exit-side portion of the first diverging path or the second diverging path, it is possible to cause the article transport vehicle to travel straight forward along the first travel path or the second travel path without diverging and to cause the article transport vehicle to diverge into and travel along the first diverging path or the second diverging path by providing the travel direction change mechanism, the non-diverging travel auxiliary guiding mechanism, the auxiliary support mechanism, and the diverging travel auxiliary guiding mechanism. As a result, it is possible with a simple configuration to switch among a non-diverging travel configuration in which the article transport vehicle is caused to travel straight forward along the first travel path or the second travel path without diverging, a first diverging travel configuration in which the article transport vehicle is caused to diverge into and travel along the first diverging path, and a second diverging travel configuration in which the article transport vehicle is caused to diverge into and travel along the second diverging path.

To describe further, it is conceivable to have a configuration for switching among the non-diverging travel configuration, the first diverging travel configuration, and the second diverging travel configuration by providing, for example, a rail body for non-diverging travel configuration, a rail body for the first diverging travel configuration, and a rail body for the second diverging travel configuration such that the position of each can be changed between a guiding position in which it is located in the travel path to guide the article transport vehicle and a retracted position in which it is retracted away from the travel path. Here, the rail body for the non-diverging travel configuration is a pair of right and left rail portions for guiding the right and left travel wheels of the travel portion in the non-diverging travel configuration. The rail body for the first diverging travel configuration is a pair of right and left rail portions for guiding the right and left travel wheels of the travel portion in the first diverging travel configuration. And the rail body for the second diverging travel configuration is a pair of right and left rail portions for guiding the right and left travel wheels of the travel portion in the second diverging travel configuration.

However, if this configuration is adapted, although the rail body for the non-diverging travel configuration, the rail body for the first diverging travel configuration, and the rail body for the second diverging travel configuration would be a large frame, it is necessary to support each of such large frames such as to allow for the position change. Thus, the support structure would be large and complicated, which leads to an disadvantage that the entire configuration becomes complicated.

In contrast, the configuration described above is one that can switch among the non-diverging travel configuration, the first diverging travel configuration, and the second diverging travel configuration while allowing the pair of right and left rail portions of the guide rail to remain in their installed positions; thus, it is not necessary to change the position of a large frame. Thus, the configuration for switching among the non-diverging travel configuration, the first diverging travel configuration, and the second diverging travel configuration, that is, the configuration for causing the article transport vehicle to travel straight forward along the first travel path or the second travel path without diverging, to diverge into and travel along the first diverging path, or to diverge into and travel along the second diverging path can be simplified.

In short, with the configuration described above, an article transport facility can be provided in which the configuration for causing the article transport vehicle to travel straight forward along the first travel path or the second travel path without diverging, or to diverge into and travel along the first diverging path or the second diverging path can be simplified.

In an embodiment of the article transport facility in accordance with the present invention, a pair of movable rails consisting of a first movable rail and a second movable rail are preferably provided so as to be associated with a first entrance-side rail portion, in the diverging-side rail portion for the first travel path, that extends along the entrance-side portion of the first diverging path, a first exit-side rail portion, in the diverging-side rail portion for the first travel path, that extends along the exit-side portion of the second diverging path, a second entrance-side rail portion, in the diverging-side rail portion for the second travel path, that extends along the entrance-side portion of the second diverging path, and a second exit-side rail portion, in the diverging-side rail portion for the second travel path, that extends along the exit-side portion of the first diverging path, wherein the pair of movable rails are preferably configured such that the arrangement of the pair of movable rails can be switched between a first diverging path forming state in which the first movable rail is in alignment with the first entrance-side rail portion and extends downstream along the first diverging path and in which the second movable rail is in alignment with the second exit-side rail portion and extends upstream along the first diverging path and a second diverging path forming state in which one of the first movable rail and the second movable rail is in alignment with the second entrance-side rail portion and extends downstream along the second diverging path and in which the other of the first movable rail and the second movable rail is in alignment with the first exit-side rail portion and extends upstream along the second diverging path, and wherein the auxiliary support mechanism is preferably configured to receive and support the article transport vehicle with the pair of movable rails.

That is, a pair of movable rails are provided so as to be associated with a first entrance-side rail portion, in the diverging-side rail portion for the first travel path, that extends along the entrance-side portion of the first diverging path, a first exit-side rail portion, in the diverging-side rail portion for the first travel path, that extends along the exit-side portion of the second diverging path, a second entrance-side rail portion, in the diverging-side rail portion for the second travel path, that extends along the entrance-side portion of the second diverging path, and a second exit-side rail portion, in the diverging-side rail portion for the second travel path, that extends along the exit-side portion of the first diverging path. And the pair of these movable rails are switched between the first diverging path forming state and the second diverging path forming state.

In the first diverging path forming state, the first movable rail is positioned such that it is in alignment with the first entrance-side rail portion and extends downstream along the first diverging path, and the second movable rail is positioned such that it is in alignment with the second exit-side rail portion and extends upstream along the first diverging path. Thus, the movable rail that is in alignment with the first entrance-side rail portion and extends downstream along the first diverging path and the movable rail that is in alignment with the second exit-side rail portion and extends upstream along the first diverging path can be positioned opposite each other.

Therefore, one of the right and left travel wheels of the travel portion traveling along the first diverging path travels on the first entrance-side rail portion and a movable rail in that order and the other of the right and left travel wheels travels on a movable rail and the second exit-side rail portion in that order. Thus, the article transport vehicle can be received and supported in the area in which the diverging-side rail portion does not exist in the first diverging path. And a section can be provided in which the right and left travel wheels are simultaneously received by the pair of opposing movable rails.

In addition, in the second diverging path forming state, one of the first movable rail and the second movable rail is in alignment with the second entrance-side rail portion and extends downstream along the second diverging path, and the other of the first movable rail and the second movable rail is in alignment with the first exit-side rail portion and extends upstream along the second diverging path. Thus, the movable rail that is in alignment with the second entrance-side rail portion and extends downstream along the second diverging path and the movable rail that is in alignment with the first exit-side rail portion and extends upstream along the second diverging path can be positioned to oppose each other.

Therefore, one of the right and left travel wheels of the travel portion traveling along the second diverging path travels on the second entrance-side rail portion and a movable rail in that order and the other of the right and left travel wheels travels on a movable rail and the first exit-side rail portion in that order. Thus, the article transport vehicle can be received and supported in the area in which the diverging-side rail portion does not exist in the second diverging path. And a section can be provided in which the right and left travel wheels are simultaneously received by the pair of opposing movable rails.

As such, by virtue of the fact that the auxiliary support mechanism receives the article transport vehicle with the pair of movable rails, the article transport vehicle can be received and supported in the area in which the diverging-side rail portion does not exist in the first diverging path or the second diverging path. In addition, a section can be provided in which both the right and left travel wheels of the travel portion traveling along the first diverging path or the second diverging path are received and supported by the movable rails. Thus, it becomes easier to stabilize the attitude of the article transport vehicle traveling along the first diverging path and the second diverging path.

In other words, if no movable rail was installed, it is conceivable to have an auxiliary support mechanism by providing, for example, an auxiliary wheel which travels on the diverging-side rail portion, in addition to the right and left travel wheels.

However, If no movable rail was installed, only one lateral side of the travel portion would be supported by the diverging-side rail portion even if an auxiliary wheel is provided. Thus, while the article transport vehicle can be guided by the diverging travel auxiliary guiding mechanism, it would be difficult to stabilize the attitude of the article transport vehicle traveling along the first diverging path or the second diverging path.

In contrast, with the configuration described above, because the pair of movable rails are provided and thus a section can be provided in which both the right and left travel wheels of the travel portion traveling along the first diverging path or the second diverging path are received and supported by the movable rails, the attitude of the article transport vehicle traveling along the first diverging path or the second diverging path can be stabilized.

In short, with the configuration described above, an article transport facility can be provided in which the attitude of the article transport vehicle traveling along the first diverging path or the second diverging path can be stabilized.

In an embodiment of the article transport facility in accordance with the present invention, the article transport vehicle preferably includes a guided member for switching paths which is located upwardly of the travel wheels of the travel portion, wherein an upper guide rail for receiving the guided member is preferably provided, wherein the upper guide rail preferably includes a diverging guide surface for achieving the diverging travel state and a non-diverging guide surface for achieving the non-diverging travel state, wherein the travel direction change mechanism is preferably configured to switch the travel state of the article transport vehicle between the diverging travel state and the non-diverging travel state by switching a guided state of the guided member between a state in which the guided member is guided by the diverging guide surface and a state in which the guided member is guided by the non-diverging guide surface, wherein the non-diverging travel auxiliary guiding mechanism is preferably configured to limit the article transport vehicle from leaning toward a side of the diverging-side rail portion by receiving the guided member with the non-diverging guide surface in the diverging path forming area.

That is, provided to the upper guide rail provided upwardly of the travel wheels of the travel portion for receiving the guided member for changing paths are the diverging guide surface for switching the travel direction of the article transport vehicle traveling along the first travel path or the second travel path to the diverging travel state for diverging toward and into the first diverging path or the second diverging path, and the non-diverging guide surface for switching to the non-diverging travel state.

And the travel direction change mechanism switches the guided state of the guided member between the state in which the guided member is guided by the diverging guide surface, and the state in which the guided member is guided by the non-diverging guide surface to switch between the diverging travel state and the non-diverging travel state.

In addition, the non-diverging guide surface is provided to receive the guided member in the diverging path forming area in order to limit the article transport vehicle from leaning toward the diverging-side rail portion side.

And the non-diverging travel auxiliary guiding mechanism receives the guided member with the non-diverging guide surface to limit article transport vehicle from leaning toward the diverging-side rail portion side.

In other words, in addition to providing the guided member and the upper guide rail to define the travel direction change mechanism, the guided member and the upper guide rail can be used to define the non-diverging travel auxiliary guiding mechanism; thus, the travel direction change mechanism and the non-diverging travel auxiliary guiding mechanism can be defined or formed by a simple configuration that makes effective use of the guided member and the upper guide rail.

In short, with the configuration described above, an article transport facility can be provided in which the configuration of the travel direction change mechanism and the non-diverging travel auxiliary guiding mechanism can be simplified.

In an embodiment of the article transport facility in accordance with the present invention, preferably formed as the diverging guide surface are a first entrance-side diverging guide surface for receiving the guided member to limit the travel portion from leaning toward a side of the travel wheel that is afloat when the travel portion travels with one of the right and left travel wheels being placed on the first entrance-side rail portion and with the other of the right and left travel wheels being afloat, a second exit-side diverging guide surface for receiving the guided member to limit the travel portion from leaning toward a side of the travel wheel that is afloat when the travel portion travels with one of the right and left travel wheels being placed on the second exit-side rail portion and with the other of the right and left travel wheels being afloat, a second entrance-side diverging guide surface for receiving the guided member to limit the travel portion from leaning toward a side of the travel wheel that is afloat when the travel portion travels with one of the right and left travel wheels being placed on the second entrance-side rail portion and with the other of the right and left travel wheels being afloat, and a first exit-side diverging guide surface for receiving the guided member to limit the travel portion from leaning toward a side of the travel wheel that is afloat when the travel portion travels with one of the right and left travel wheels being placed on the first exit-side rail portion and with the other of the right and left travel wheels being afloat, wherein the diverging travel auxiliary guiding mechanism is preferably configured to guide the article transport vehicle such that the guided member is received by the first entrance-side diverging guide surface and the second exit-side diverging guide surface when the article transport vehicle travels along the first diverging path and such that the guided member is received by the second entrance-side diverging guide surface and the first exit-side diverging guide surface when the article transport vehicle travels along the second diverging path.

That is, the first entrance-side diverging guide surface, the second exit-side diverging guide surface, the second entrance-side diverging guide surface, and the first exit-side diverging guide surface are formed as the diverging guide surface provided to the upper guide rail.

And the diverging travel auxiliary guiding mechanism guides the article transport vehicle such that the guided member is received by the first entrance-side diverging guide surface and the second exit-side diverging guide surface when the article transport vehicle travels along the first diverging path, and such that the guided member is received by the second entrance-side diverging guide surface and the first exit-side diverging guide surface when an article transport vehicle travels along the second diverging path.

In other words, when the article transport vehicle travel along the first diverging path, by receiving the guided member with the first entrance-side diverging guide surface, the travel portion, that is traveling with one of the right and left travel wheels being placed on and in contact with the first entrance-side rail portion and with the other of the right and left travel wheels being afloat, can be limited from leaning toward the side of the wheel that is afloat: and by receiving the guided member with the second exit-side diverging guide surface, the travel portion, that is traveling with one of the right and left travel wheels being placed on and in contact with the second exit-side rail portion and with the other of the right and left travel wheels being afloat, can be limited from leaning toward the side of the wheel that is afloat.

Similarly, when the article transport vehicle travel along the second diverging path, by receiving the guided member with the second entrance-side diverging guide surface, the travel portion, that is traveling with one of the right and left travel wheels being placed on and in contact with the second entrance-side rail portion and with the other of the right and left travel wheels being afloat, can be limited from leaning toward the side of the wheel that is afloat: and by receiving the guided member with the first exit-side diverging guide surface, the travel portion, that is traveling with one of the right and left travel wheels being placed on and in contact with the first exit-side rail portion and with the other of the right and left travel wheels being afloat, can be limited from leaning toward the side of the wheel that is afloat.

Thus, with the configuration described above, the configuration of the diverging travel auxiliary guiding mechanism can be simplified since the diverging travel auxiliary guiding mechanism can be defined or formed by making effective use of the guided member and the upper guide rail which are provided to define the travel direction change mechanism and he non-diverging travel auxiliary guiding mechanism.

In short, with the configuration described above, an article transport facility can be provided in which the configuration of the diverging travel auxiliary guiding mechanism can be simplified.

In an embodiment of the article transport facility in accordance with the present invention, an attitude changing portion which is a part of a portion that defines the diverging guide surface of the upper guide rail is preferably configured to be able to switch a positional arrangement between a first state in which the first entrance-side diverging guide surface and the second exit-side diverging guide surface overlap with each other in the longitudinal direction of the first diverging path and a second state in which the second entrance-side diverging guide surface and the first exit-side diverging guide surface overlap with each other in the longitudinal direction of the second diverging path.

That is, the guided member can be received and guided precisely by the upper guide rail by switching the attitude changing portion to the first state when the article transport vehicle is to diverge into and travel along the first diverging path, and by switching the attitude changing portion to the second state when the article transport vehicle is to diverge into and travel along the second diverging path.

More specifically, if the attitude changing portion was not provided, it would be necessary to provide a space between the first entrance-side diverging guide surface and the second exit-side diverging guide surface for allowing the guided member to pass when the article transport vehicle travels along the second diverging path, since the first diverging path and the second diverging path are formed such that they intersect each other in plan view. Similarly, it would be necessary to provide a space between the second entrance-side diverging guide surface and the first exit-side diverging guide surface for allowing the guided member to pass when the article transport vehicle travels along the first diverging path.

Thus, if the attitude changing portion was not provided, there is a possibility that the guided member received by the first entrance-side diverging guide surface cannot transition into a state in which the guided member is received by the second exit-side diverging guide surface when the article transport vehicle travels along the first diverging path, as well as a possibility that the guided member received by the second entrance-side diverging guide surface cannot transition into a state in which the guided member is received by the first exit-side diverging guide surface when the article transport vehicle travels along the second diverging path.

In contrast, with the configuration described above, the attitude changing portion is switched to the first state when the article transport vehicle is to diverge into and travel along the first diverging path so that the first entrance-side diverging guide surface and the second exit-side diverging guide surface overlap with each other in the longitudinal direction of the first diverging path and so that the guided member received by the first entrance-side diverging guide surface can properly transition into a state in which the guided member is received by the second exit-side diverging guide surface.

Similarly, the attitude changing portion is switched to the second state when the article transport vehicle is to diverge into and travel along the second diverging path so that the second entrance-side diverging guide surface and the first exit-side diverging guide surface overlap with each other in the longitudinal direction of the second diverging path and so that the guided member received by the second entrance-side diverging guide surface can properly transition into a state in which the guided member is received by the first exit-side diverging guide surface.

In short, with the configuration described above, an article transport facility can be provided in which the guided member can be received and guided precisely by the upper guide rail when the article transport vehicle is to diverge into and travel along the first diverging path or the second diverging path.

In an embodiment of the article transport facility in accordance with the present invention, a single actuating device operatively connected with the pair of movable rails and with the attitude changing portion is preferably provided, wherein the actuating device is preferably configured to be able to switch between a first diverging state in which the pair of movable rails are in the first diverging path forming state and in which the attitude changing portion is in the first state and a second diverging state in which the pair of movable rails are in the second diverging path forming state and in which the attitude changing portion is in the second state.

That is, a single actuating device is operatively connected with the pair of movable rails and with the attitude changing portion. And the single actuating device can be used to switch between the first diverging state in which the pair of movable rails are in the first diverging path forming state and in which the attitude changing portion is in the first state and the second diverging state in which the pair of movable rails are in the second diverging path forming state and in which the attitude changing portion is in the second state.

As such, since the pair of movable rails and the attitude changing portion can be operated by a single actuating device to switch between the first diverging state and the second diverging state, the operating configuration (actuating configuration) for the pair of movable rails and the attitude changing portion can be simplified while making it possible to precisely switch the pair of movable rails and the attitude changing portion between the first diverging state and the second diverging state.

In other words, it is conceivable to have a configuration in which the pair of movable rails and the attitude changing portion are switched between the first diverging state and the second diverging state by a separate actuating device provided for operating each of the pair of movable rails as well as an actuating device provided for operating the attitude changing portion. However, since it would be necessary to have three actuating devices in this configuration, the configuration for operating the pair of movable rails and the attitude changing portion may become complicated.

In contrast, with the configuration described above, an article transport facility can be provided in which the configuration for operating the pair of movable rails and the attitude changing portion can be simplified.

DETAILED DESCRIPTION

[First Embodiment]

The first embodiment of an article transport facility of the ceiling installation type in accordance with the present invention is described next with reference to the drawings.

Figure 2:
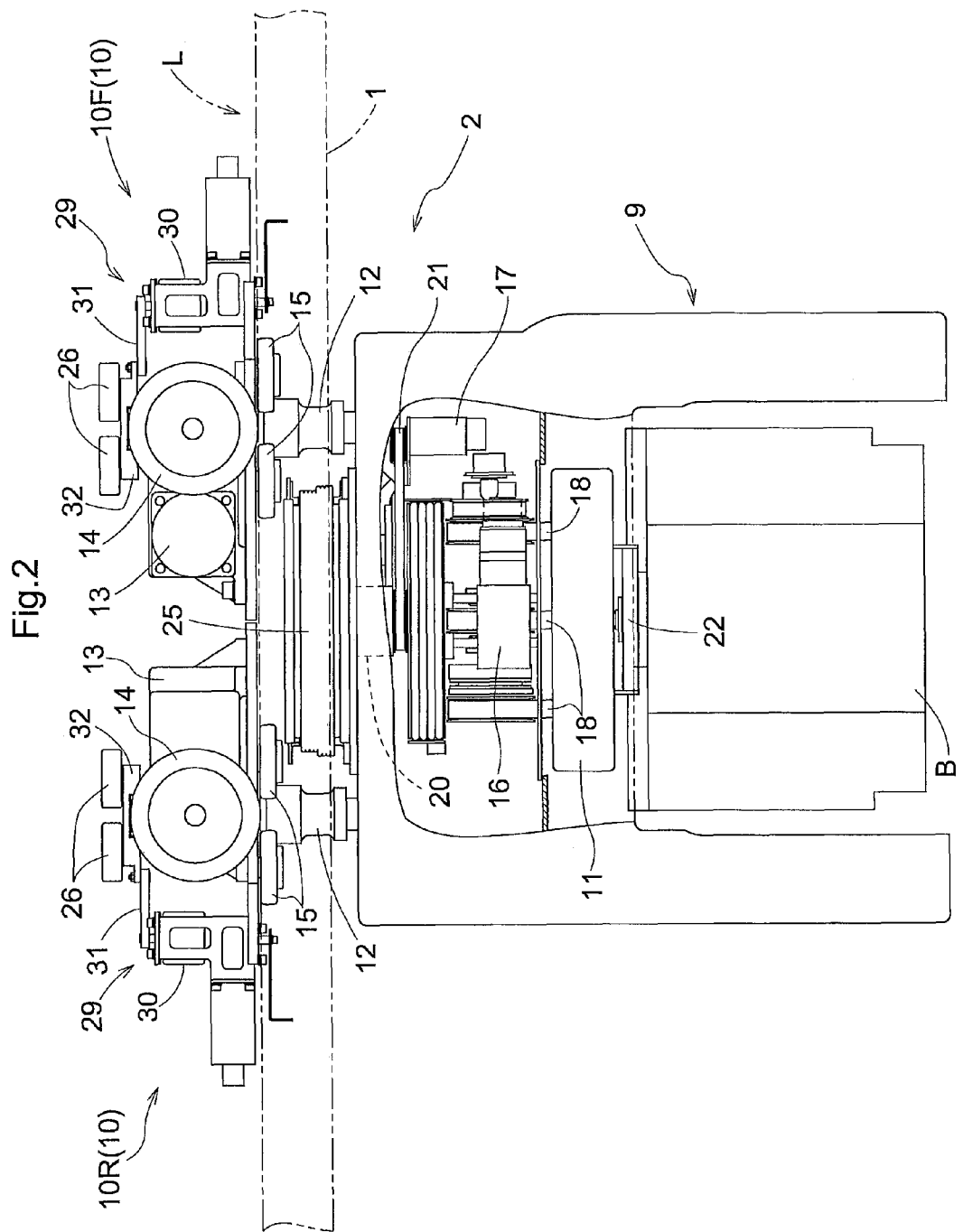
FIG. 2 is a side view of an article transport vehicle.
Figure 3:
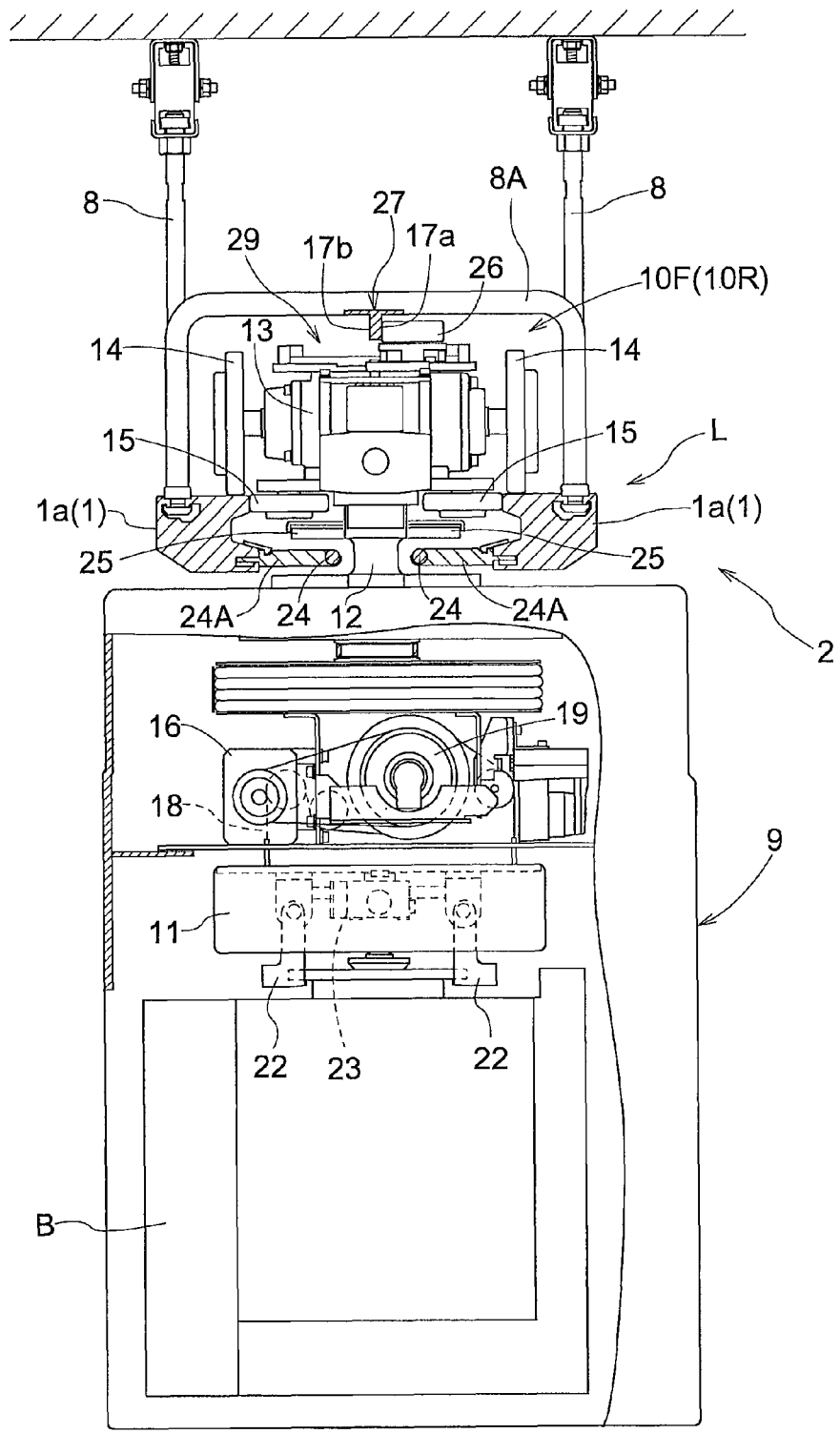
FIG. 3 is a partial cut-out front view of the article transport vehicle.
Figure 4:
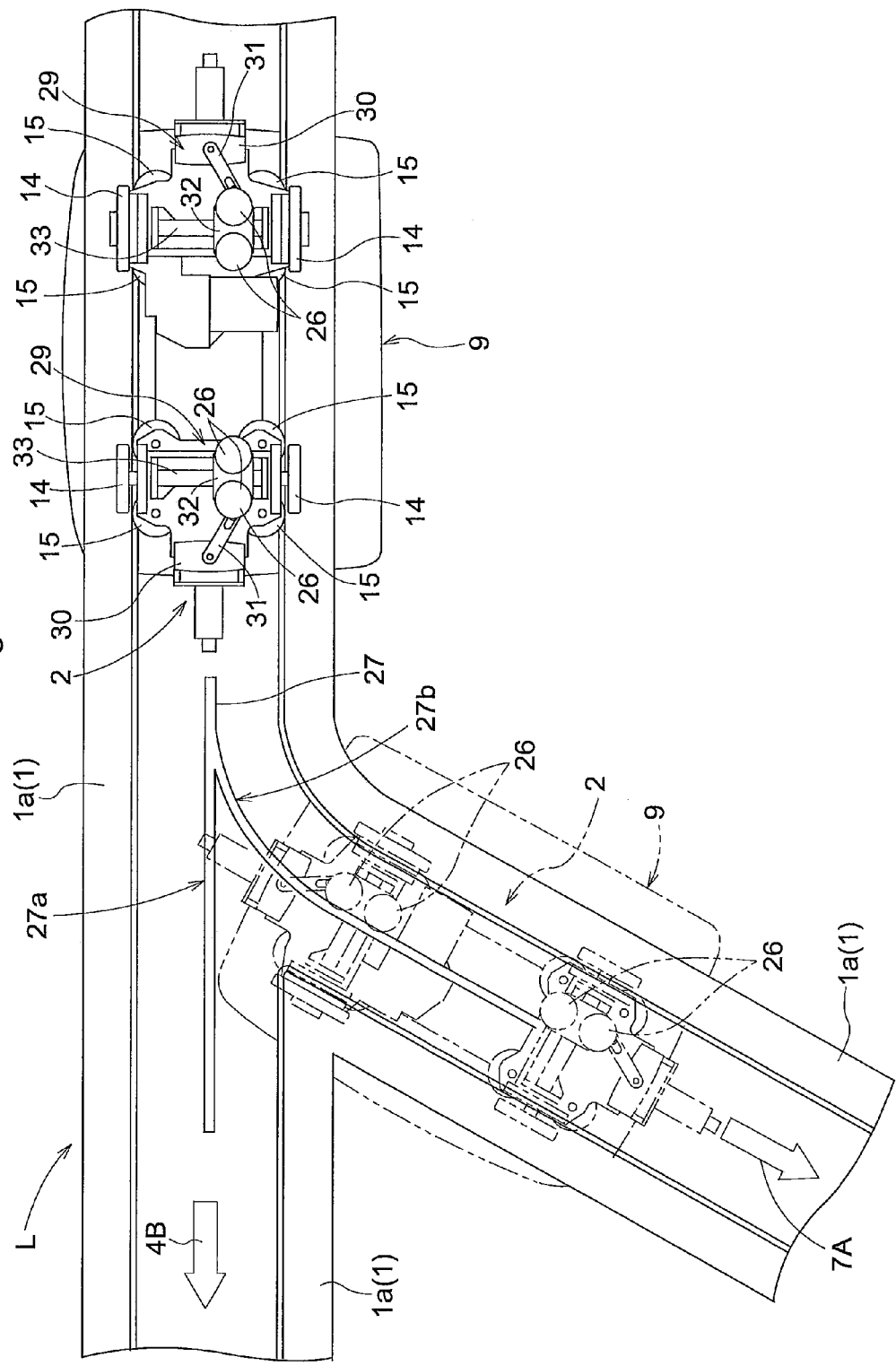
FIG. 4 is a plan view showing how the article transport vehicle travels at a diverging location.

As shown in FIGS. 2-4, a travel guide member L including guide rails 1 is provided on the ceiling side (on the ceiling side of a clean room in the present example). And article transport vehicles 2 each of which is configured to travel along the travel guide member L is provided.

In the present embodiment, each article transport vehicle 2 is configured to transport, as an article B, a container for housing or carrying semiconductor substrates.

Figure 1:
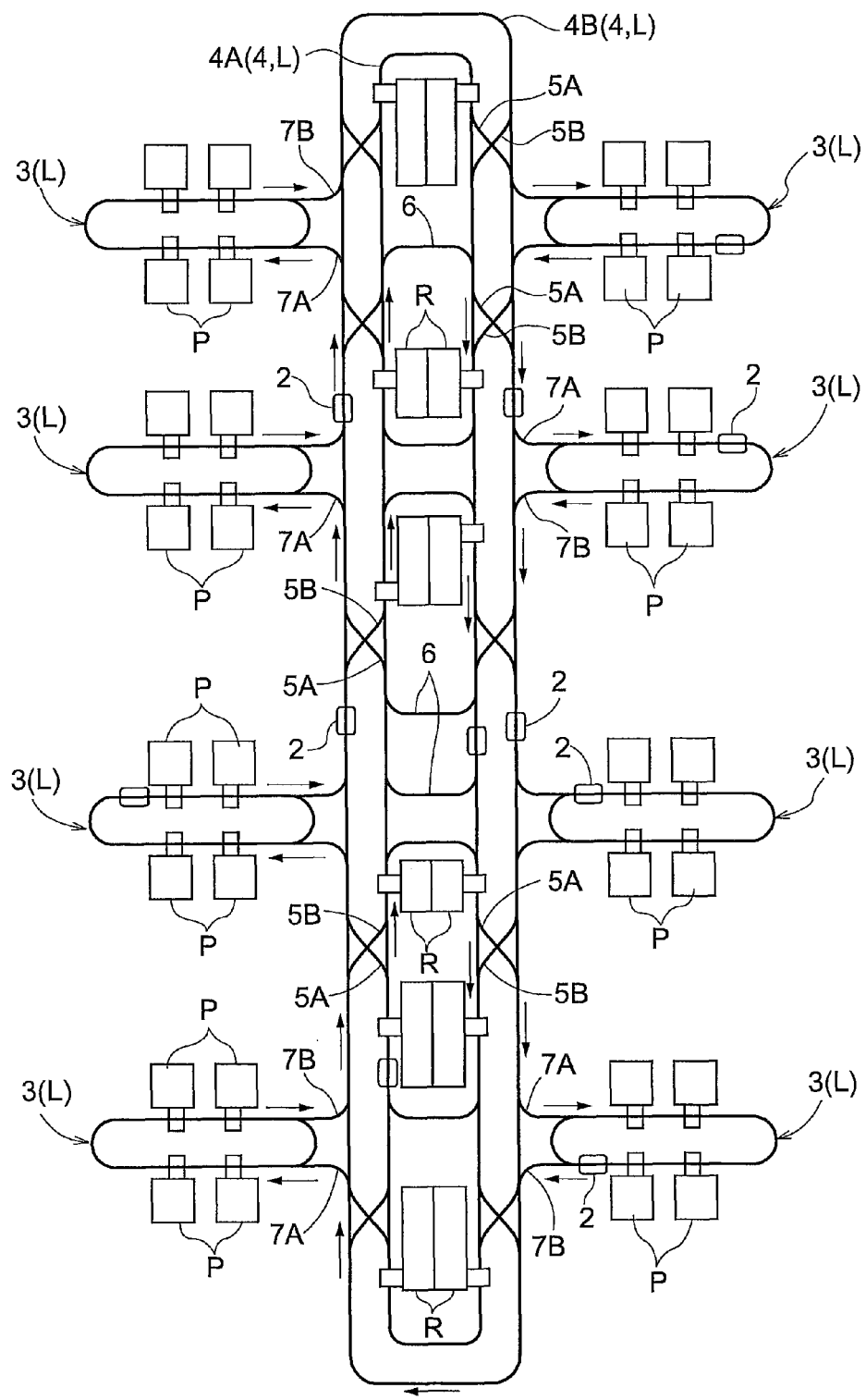
FIG. 1 is a diagrammatic plan view of an article transport facility of a type that is installed to the ceiling or in the ceiling area.

As shown in FIG. 1, the travel guide member L defines or forms a plurality of travel paths 4 for the article transport vehicles 2 and also defines diverging paths 5A, 5B for connecting different travel paths 4 to each other. In the present embodiment, the travel guide member L further defines or forms a plurality of loop-shaped secondary travel paths 3 each of which extends by way of or along a plurality of article processors P. In addition, the travel guide member L defines or forms two loop-shaped travel paths 4 in the present embodiment.

The two loop-shaped travel paths 4 are formed adjacent to each other in a lateral direction of the paths. In addition, the two travel paths 4 are formed such that they are nested with one loop within another (one loop within the other, or a double loop in the present example). That is, the two travel paths 4 are formed such that they do not intersect each other in plan view. The article transport vehicles 2 are configured to travel in the same direction along these two travel paths 4. The travel directions of the article transport vehicles 2 are indicated by the arrows in FIG. 1.

Incidentally, each of the two loop-shaped travel paths 4 is generally formed in a shape of an elongated rectangle in plan view with each of the four corners rounded to be arc-shaped.

In the following description, the inner travel path 4, of the pair of loop-shaped travel paths 4 that form a double loop, is referred to as the first travel path 4A whereas the outer travel path 4 is referred to as the second travel path 4B. And when it is not necessary to distinguish one travel path from the other, each is referred to simply as the travel path 4.

First diverging paths 5A through each of which the article transport vehicle 2 diverges, or travels away, from the first travel path 4A and into the second travel path 4B and second diverging paths 5B through each of which the article transport vehicle 2 diverges, or travels away, from the second travel path 4B and into the first travel path 4A are defined or formed by the travel guide member L between the pair of travel paths 4 that form the double loop. That is, each of the first diverging paths 5A and each of the second diverging paths 5B is a diverging path which connects the first travel path 4A and the second travel path 4B with each other.

Each of the first diverging paths 5A and each of the second diverging paths 5B are formed such that each extends in a direction that is slanted, inclined or angled, with respect to either travel path 4 in plan view. And the first diverging path 5A and the corresponding second diverging path B are formed such that they intersect each other in plan view.

In other words, an X-shaped diverging location is formed by a first diverging path 5A and the corresponding second diverging path 5B. And in the present embodiment, a plurality of the X-shaped diverging locations are provided along the longitudinal direction of the travel paths 4.

Specific configuration of the first diverging path 5A and the second diverging path 5B, i.e., the specific configuration of the X-shaped diverging location, is described below.

In addition, formed between the pair of right and left portions that correspond to the long sides of the first travel path 4A are shortcut paths 6 for allowing the article transport vehicles 2 to travel from one to the other of the right and left portions that correspond to the long sides of the first travel path 4A. In the present embodiment, a plurality of shortcut paths 6 are provided along the longitudinal direction of the first travel path 4A.

Each of the plurality of loop-shaped secondary travel paths 3 is generally formed in a shape of an elongated circle or loop in which both ends of a pair of straight parallel portions are connected to each other by arc-shaped portions. The secondary travel paths 3 are formed on both-sides of, and adjacent to, the two loop-shaped travel paths 4 such that the longitudinal direction of each secondary travel path 3 is perpendicular to the longitudinal direction of the travel paths 4 in plan view. In addition, a plurality of secondary travel paths 3 are provided such that they are arranged in rows and are spaced apart from one another along the longitudinal direction of the travel paths 4.

Also provided are diverging connecting paths 7A each of which allows the article transport vehicles 2 to diverge from the second travel path 4B of the pair of travel paths 4 into the corresponding one of the secondary travel paths 3, and converging connecting paths 7B each of which allows the article transport vehicles 2 to converge from a secondary travel path 3 into the second travel path 4B.

As shown in FIG. 1, a plurality of the article transport vehicles 2 are provided in the present embodiment. And, as stated above, each article transport vehicle 2 is configured to transport, as an article B, a container that houses semiconductor substrates. In addition, a plurality of storage portions R for temporarily storing the articles B are arranged along the longitudinal direction of the first travel path 4A and are also arranged side by side in the right and left direction at locations inside the first travel path 4A.

In addition, a plurality of article processors P exist for performing different processes on the semiconductor substrates.

Therefore, each article transport vehicle 2 performs a transport operation to transport an article B received from the article processor P to a storage portion R or to another article processor P that performs another process as well as a transport operation to transport an article B received from a storage portion R to an article processor P.

Accordingly, the second travel path 4B of the pair of travel paths 4 is used as a travel path for continuous traveling in which the article transport vehicles 2 travel continuously whereas the first travel path 4A is used as a travel path for article transfer in which the article transport vehicles 2 are stopped at article transfer locations to transfer articles B to or from the storage portions R.

And when an article transport vehicle 2 traveling along the second travel path 4B needs to transfer an article B to or from one of the storage portions R, the article transport vehicle 2 is caused to diverge into the first travel path 4A at an X-shaped diverging location. And the article transport vehicle 2 that has completed the transfer of an article B to or from the storage portion R is caused to diverge into the second travel path 4B at an X-shaped diverging location. The plurality of article transport vehicles 2 can travel smoothly in this manner.

In addition, when an article transport vehicle 2 traveling along the second travel path 4B needs to transfer an article B to or from one of the article processors P, the article transport vehicle 2 is caused to travel along a diverging connecting path 7A to diverge into a secondary travel path 3. And the article transport vehicle 2 that has completed the transfer of the article B to or from the article processors P is caused to travel along a converging connecting path 7B to converge into the second travel path 4B.

Incidentally, a plurality of article transfer locations exist along the first travel path 4A, and the X-shaped diverging locations are provided at a plurality of locations. Thus, even if there is an article transport vehicle 2 that has stopped in the first travel path 4A to transfer an article, an article transport vehicle 2 traveling along the second travel path 4B can advantageously diverge into the first travel path 4A to travel to its target article transfer location by allowing this article transport vehicle 2 to travel past the article transport vehicle 2 that has stopped in the first travel path 4A. The article transport vehicle 2 that has completed the transfer of the article B can advantageously diverge from the first travel path 4A into the second travel path 4B by allowing it to travel past the article transport vehicle 2 stopped for article transfer.

Further, since a plurality of shortcut paths 6 are connected to the first travel path 4A, it is possible to shorten the transporting distance from a given transport origin to a given transport destination by causing the article transport vehicle 2 to travel through one or more shortcut paths 6.

Additional descriptions are provided next about the configuration of each part.

The travel guide member L includes guide rails 1 arranged to extend along the travel paths 4 and the secondary travel paths 3. As shown in FIG. 3, the guide rails 1 are suspended from the ceiling portion by travel rail supports 8. In addition, as shown in FIGS. 3 and 4, the guide rails 1 include a pair of right and left rail portions 1a that are spaced apart from each other in a rail lateral direction (that is, path lateral direction).

The travel guide member L includes the pair of right and left rail portions 1*a* for each of the first travel path 4A and the second travel path 4B.

In the following description, for the guide rails 1 arranged along the first travel path 4A and the second travel path 4B, the rail portion 1*a*, of the pair of right and left rail portions 1*a*, that is arranged on the side in which the first diverging path 5A or the second diverging path 5B exists is referred to as a diverging side rail portion 1A whereas the rail portion 1*a* arranged on the side that is away from the first diverging path 5A or the second diverging path 5B is referred to as a spaced-apart side rail portion 1B. Each is referred to simply as the rail portion 1*a* when it is not necessary to distinguish one from the other.

In addition, in the following description, the lateral direction of the article transport vehicle 2 is referred to as the vehicle body lateral direction. The fore and aft direction of the article transport vehicle 2 is referred to as the vehicle body fore and aft direction. And the vertical direction of the article transport vehicle 2 is referred to as the vehicle body vertical direction.

As shown in FIGS. 2 and 3, each article transport vehicle 2 includes a vehicle main body 9 located below the travel guide member L and a travel portion 10 that travels along the travel guide member L. The vehicle main body 9 includes a grip portion 11 for gripping an article B with the article B suspended therefrom.

The travel portion 10 includes a front travel portion 10F and a back travel portion 10R with the front and back travel portions arranged in the fore and aft direction. And a connecting shaft 12 that extends downwardly and along the vertical direction from each of the front travel portion 10F and the back travel portion 10R is provided such that it extends downwardly between the pair of right and left rail portions 1*a*.

And the vehicle main body 9 is supported by, and suspended from, each of the front travel portion 10F and the back travel portion 10R by means of the connecting shafts 12 such that the vehicle main body 9 is rotatable about the axes of the connecting shafts 12 with respect to each of the front travel portion 10F and the back travel portion 10R.

Provided to each of the front travel portion 10F and the back travel portion 10R are right and left travel wheels 14 which are driven and rotated by the electric-powered drive motor 13 for traveling on the travel surface formed on the top surface of each of the pair of right and left rail portions 1*a*, 1*b*. In addition, also provided to each of the front travel portion 10F and the back travel portion 10R are right and left guide wheels 15 which can freely rotate about axes extending along the vehicle body vertical direction (i.e. about vertical axes) such that the guide wheels 15 contact guide surfaces defined by inward side surfaces of the pair of right and left rail portions 1*a*.

Note that two sets of guide wheels 15 are provided to each of the front travel portion 10F and the back travel portion 10R with one behind the other in the vehicle body fore and aft direction.

Therefore, the article transport vehicle 2 is configured to travel along the guide rails 1 by virtue of the fact that the travel wheels 14 of the front travel portion 10F and the back travel portion 10R are driven and rotated with the vehicle position in the vehicle body lateral direction being restricted by the guide wheels 15 of the front travel portion 10F and the back travel portion 10R which are guided by the pair of rail portions 1*a*.

In addition, the article transport vehicle 2 is configured to travel smoothly even in an arc-shaped or curved path portion such as an arc-shaped portion of the travel paths 4, an arc-shaped portion of the secondary travel paths 3, etc., by virtue of the fact that the front travel portion 10F and the back travel portion 10R are deflected with respect to the vehicle main body 9 about the axes of the connecting shafts 12 (i.e. about the axes extending along the vehicle body vertical direction).

As shown in FIG. 2, the vehicle main body 9 is constructed such that its forward end side portion and its rearward end side portion in the vehicle body fore and aft direction extend downwardly, and such that the main body has an inverted U-shape that opens downwardly, or with its lower side open. The grip portion 11 is located between the downwardly extending forward and rearward end side portions. The vehicle main body 9 is provided with an electric-powered vertical movement motor 16 for raising and lowering, or vertically moving, the grip portion 11 as well as an electric-powered turning motor 17 for turning the grip portion 11 about a vertical axis.

More specifically, the vertical movement motor 16 is configured to vertically move the grip portion 11 between a raised position and a lowered position by rotating, in forward and reverse directions, rotating drums 19 around which belts 18, which function as string elements, are spooled to spool and feed out the belts 18.

As shown in FIG. 2 and FIG. 3, the raised position is a position in which the grip portion 11 is housed in an upper area inside the vehicle main body 9 and the lowered position, while not shown, is a position in which the grip portion 11 is close to a transfer station of an article processor P or a storage portion R.

The grip portion 11 is connected to the vehicle main body 9 such that it can be rotated with respect to the vehicle main body 9 about a rotation shaft 20 (see FIG. 2) which extends downwardly from an upper end portion of the vehicle main body 9. And the grip portion 11 is configured to be rotated about the vertical axis as the turning motor 17 drives and rotates the rotation shaft 20 about the vertical axis through the rotation force transfer portion 21.

The grip portion 11 includes a gripper 22 for gripping an article B. And the gripper 22 is configured to be switched by an electric-powered gripper motor 23 between a gripping attitude in which the article B is gripped and a grip release attitude in which the grip is released. FIG. 3 shows the state where the gripper 22 is switched to the gripping attitude.

Each article transport vehicle 2 has a carriage side controller (not shown) for controlling the operations of the article transport vehicle 2 by controlling traveling operations of the front travel portion 10F and the back travel portion 10R, vertical movement operations of the grip portion 11, and attitude switching operations of the gripper 22, etc.

And the carriage side controller is configured to perform a transport process in which an article B is transported from a station of transport origin to a station of transport destination specified in a transport command when the carriage side controller receives, by means of wireless communications etc., the transport command which specifies the station of transport origin and the station of transport destination from the facility management computer which manages operations of the plurality of article transport vehicles 2.

More specifically, each article transport vehicle 2 includes various sensors, such as a sensor for detecting a target stopping position corresponding to each station, and a sensor for detecting the traveled distance of the article transport vehicle 2 from a reference point.

And the carriage side controller is configured to control the traveling operation of the front travel portion 10F and the back travel portion 10R based on the detected information from these various sensors to travel to the specified station of transport origin and to travel from the station of transport origin to the station of the specified transport destination. In addition, the carriage side controller is configured to control the vertical movement operation of the grip portion 11 and the attitude switching operation of the gripper 22 at the station of transport origin to receive an article B from the station of transport origin, and is also configured to control the vertical movement operation of the grip portion 11 and the attitude switching operation of the gripper 22 at the station of transport destination to unload the article B to the station of transport destination.

The article transport vehicle 2 is configured to be powered by electric power supplied from outside the vehicle 2.

That is, as shown in FIG. 3, a pair of right and left electricity supply line 24 for supplying driving electric power to the article transport vehicle 2 are provided to the travel guide member L such that they extend along each of the travel paths 4 and the secondary travel paths 3, etc., similarly to the pair of right and left rail portions 1a.

More specifically, a holding portion 24A that extends inwardly in the vehicle body lateral direction is provided to a lower end portion of each of the pair of right and left rail portions 1a. And the pair of right and left electricity supply lines 24 are fixedly supported by distal end portions of the holding portions 24A.

In addition, as shown in FIGS. 2 and 3, a single power receiving portion (power receiving coil) 25, to which driving electric power is supplied from the right and left electricity supply lines 24 without contact or contactlessly, is provided to the vehicle main body 9 of the article transport vehicle 2 such that the power receiving portion 25 is located between the pair of front and back connecting shafts 12.

And magnetic field is generated by applying alternating currents to the electricity supply lines 24. The magnetic field, in turn, causes the power receiving portion 25 to generate driving electric power. Thus, the driving electric power is supplied to the article transport vehicle 2 without contact.

Figure 5:
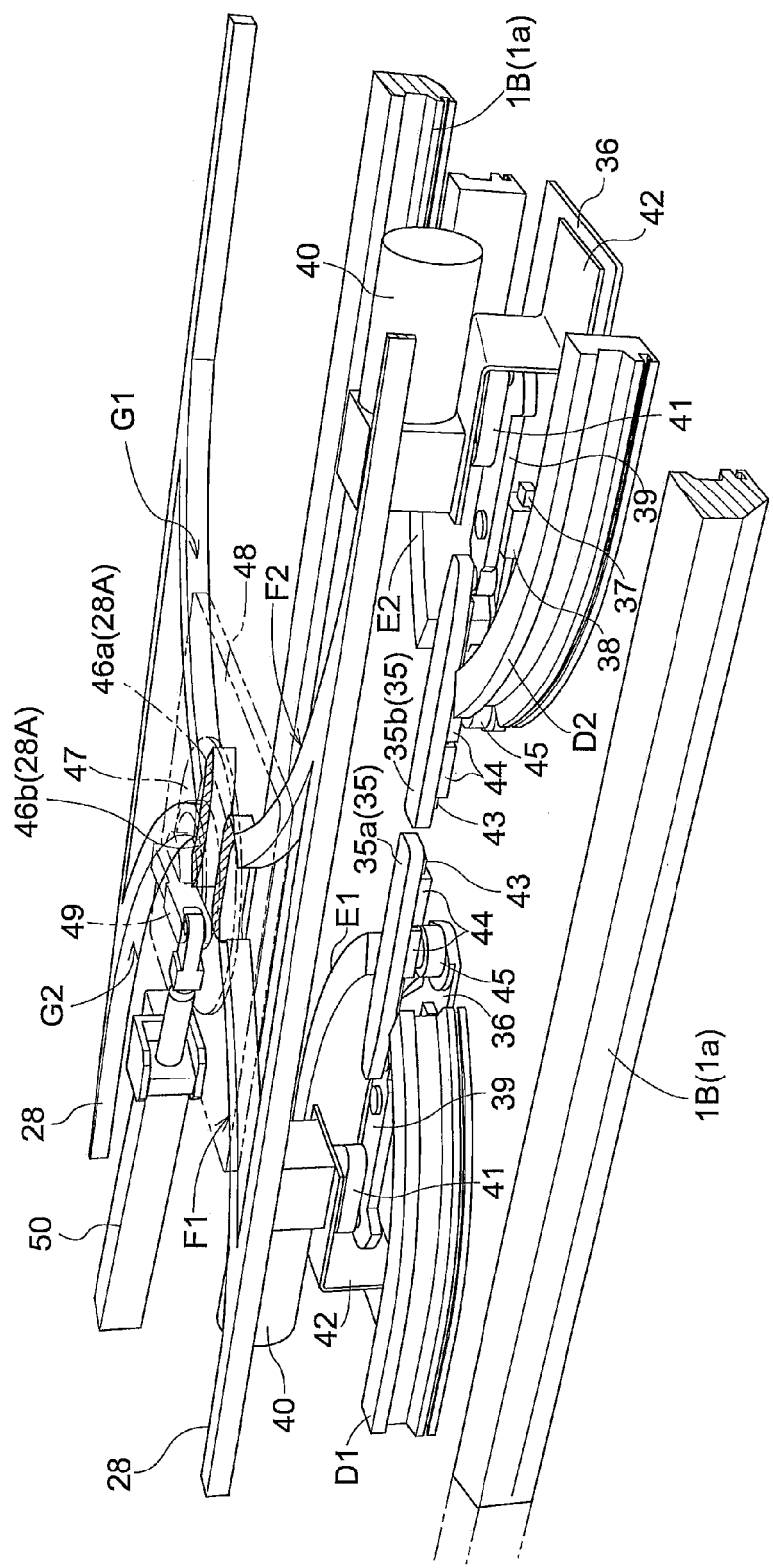
FIG. 5 is a perspective view of an X-shaped diverging location in accordance with the first embodiment.
Figure 6:
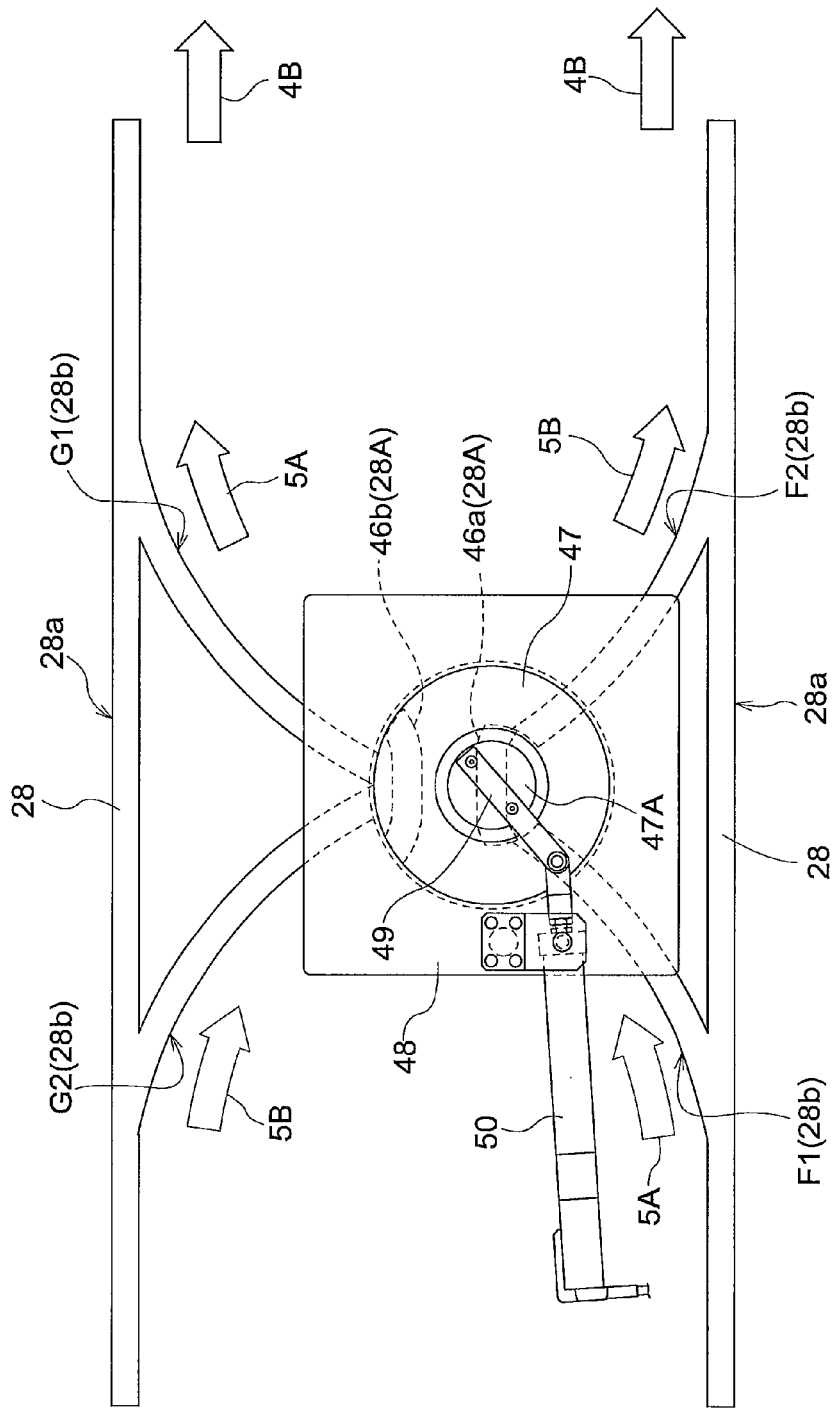
FIG. 6 is a plan view showing an upper guide rail at the same location.

As shown in FIGS. 2 and 3, guide wheels 26 (a pair of front and back guide wheels 26 in the present example) that can rotate about vertical axes (axes extending along the vehicle body vertical direction) are installed, as guided members for switching paths, above the travel wheels 14 in each of the front travel portion 10F and the back travel portion 10R. As shown in FIGS. 3 and 4, an upper guide rail 27 for guiding the guide wheels 26 is provided at each diverging location and converging location in the travel guide member L. Similarly, as shown in FIGS. 5 and 6, an upper guide rail 28 for guiding the guide wheels 26 is provided at each X-shaped diverging location.

As shown in FIG. 3, a plurality of inverted U-shaped frames 8A are installed along the longitudinal direction of the guide rails 1 at suitable intervals such that each frame 8A is connected to and supported by the guide rails 1. And the upper guide rails 27 and 28 are supported by the inverted U-shaped frames 8A.

Incidentally, FIG. 4 shows, as an example, an upper guide rail 27 at a diverging location at which a diverging connecting path 7A is connected to the second travel path 4B.

In addition to the diverging locations at which a diverging connecting path 7A is connected to the second travel path 4B, diverging locations include those at which a shortcut path 6 is connected to the first travel path 4A. In addition, converging locations include those at which a converging connecting path 7B is connected to the second travel path 4B as well as converging locations at which a shortcut path 6 is connected to the first travel path 4A.

The upper guide rail 27 at a converging location and a diverging location is described first.

The upper guide rail 27 at a diverging location guides the guide wheels 26 to define the direction of a diverging travel of the article transport vehicle 2. In addition, the upper guide rail 27 guides the guide wheels 26 such that a proper attitude of the article transport vehicle 2 is maintained even when the guide rail 1 is located only on one side in the vehicle body lateral direction at a diverging location and a converging location.

To describe in more detail, in order to allow the connecting shafts 12 to pass through a diverging location and a converging location, an area or a section exists, at each diverging location and converging location, where the rail portion 1a of the guide rail 1 is provided only on one side in the lateral direction of the article transport vehicle 2. The facility is configured to maintain the proper attitude of the article transport vehicle 2 by guiding the guide wheels 26 with the upper guide rail 27 in such areas.

In addition, since, at a diverging location, the article transport vehicle 2 needs to be switched between a state in which the article transport vehicle 2 is caused to travel straight forward and a state in which the article transport vehicle 2 is caused to diverge, the travel direction or the diverging direction of the article transport vehicle 2 can be selected by guiding the guide wheels 26 with the upper guide rail 27.

As shown in FIG. 4, the upper guide rail 27 is formed to have a two-pronged shape in plan view. The upper guide rail 27 includes the first guide surface 27a for causing a straight-forward travel, and the second guide surface 27b for causing a diverging travel or a converging travel, as guide surfaces for guiding the guide wheels 26.

The guide wheels 26 are provided to each of the front travel portion 10F of the article transport vehicle 2 and the back travel portion 10R. And a guide surface switching mechanism 29 is provided to each of the front travel portion 10F and the back travel portion 10R in order to switch the guided state of the guide wheels 26 between a state in which the guide wheels 26 are guided by the first guide surface 27a and a state in which the guide wheels 26 are guided by the second guide surface 27b by changing the position of the guide wheels 26 with respect to the upper guide rail 27 in the vehicle body lateral direction.

The guide surface switching mechanism 29 includes a pivot arm 31 which can be pivoted about a vertical axis by an actuator 30 such as a motor, a movable body 32 provided at a distal end portion of the pivot arm 31, and a travel guide portion 33 for movably guiding and supporting the movable body 32 in a fixed range along the vehicle body lateral direction. The guide wheels 26 are supported at distal end portions (end portions on the upper side) of the movable body 32 such that the guide wheels 26 can be rotated about the vertical axes.

And the guide surface switching mechanism 29 is configured to switch the guide surface for guiding the guide wheels 26 between the first guide surface 27a and the second guide surface 27b by pivoting the pivot arm 31 with the actuator 30 and thus by changing the position of the guide wheel 26 along the vehicle body lateral direction.

Note that FIG. 4 shows the state in which the guide surface switching mechanism 29 is switched such that the guide wheels 26 are guided by the second guide surface 27b of the upper guide rail 27.

While not shown, an upper guide rail 27, which is two-pronged in plan view, is provided at each converging location, similarly to the diverging portion location described above.

And the guide surface switching mechanism 29 is configured to switch the guide surface for guiding the guide wheels 26 between the first guide surface 27a and the second guide surface 27b by pivoting the pivot arm 31 with the actuator 30 and thus by changing the position of the guide wheel 26 along the vehicle body lateral direction.

X-shaped diverging locations are described next.

Figure 7:
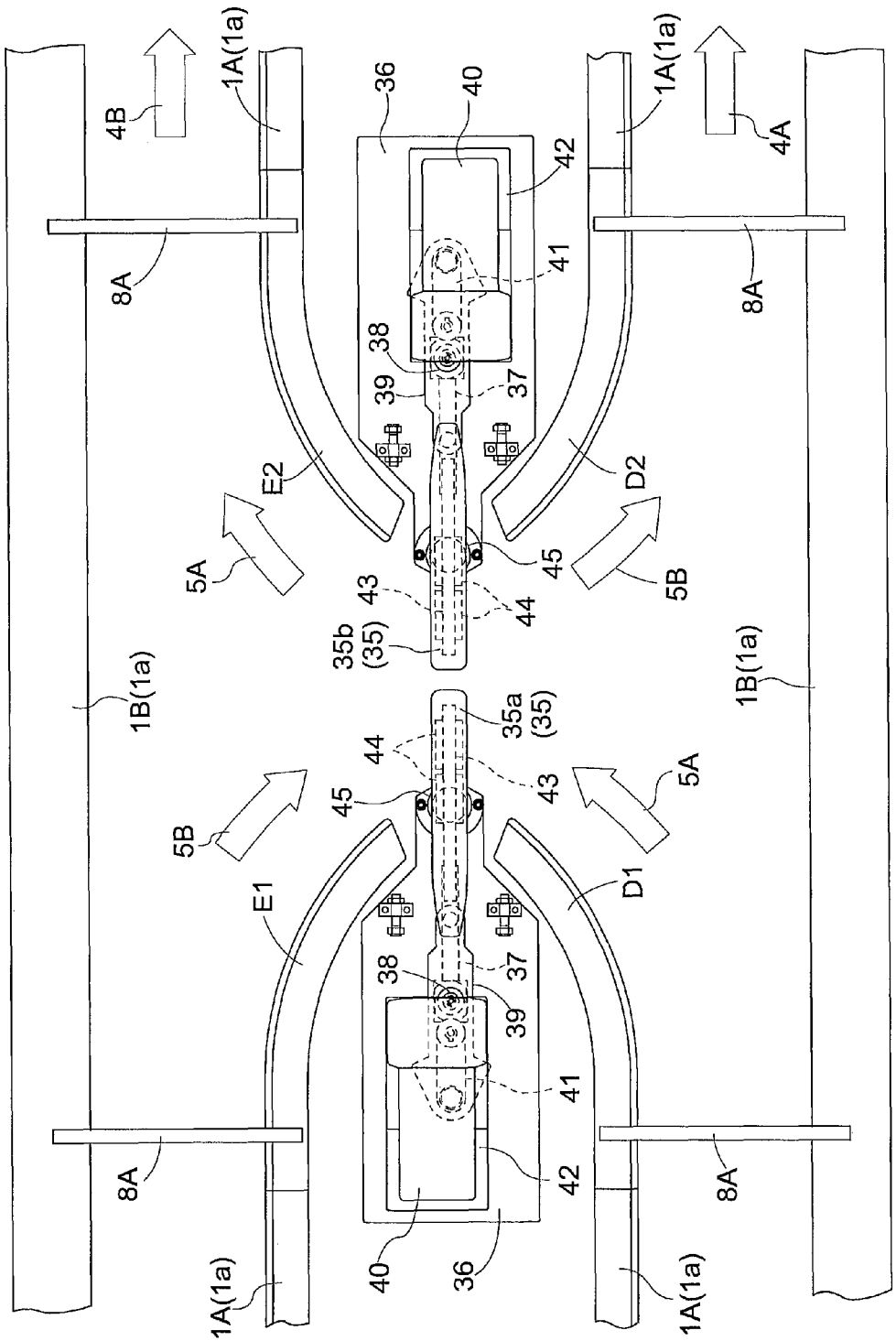
FIG. 7 is a plan view showing the guide rails at the same location.

As shown in FIGS. 5 and 7, each diverging side rail portion 1A (of the rail portions 1a provided along the first travel path 4A and the second travel path 4B) that is located on the side of the first diverging path 5A and the second diverging path 5B, is formed, in a diverging path forming location between an entrance portion of the first diverging path 5A or the second diverging path 5B and an exit portion of the second diverging path 5B or the first diverging path 5A (i.e., in the diverging path forming area between the entrance portion and the exit portion), such that the diverging side rail portion 1A extends along, or follow the shape of, the entrance-side portion or exit-side portion of the first diverging path 5A or the second diverging path 5B. In addition, each diverging side rail portion 1A is formed to be discontinuous to form a cut or a gap at a location of an intersection portion between the first diverging path 5A and the second diverging path 5B (that is, in the intersection or crossing area between the first diverging path 5A and the second diverging path 5B) to allow the connecting shafts 12 to pass through the location.

In addition, each spaced-apart side rail portion 1B (of the rail portions 1a provided along the first travel path 4A and the second travel path 4B), that is located on the side that is away from the first diverging path 5A or the second diverging path 5B, is formed so as to extend in a straight line in the diverging path forming area.

A pair of movable rails 35, namely the first movable rail 35a and the second movable rail 35b, are provided in association with a first entrance-side rail portion D1 (of the diverging side rail portion 1A of the first travel path 4A) which extends along the entrance-side portion of the first diverging path 5A, a first exit-side rail portion D2 (of the diverging-side rail portion 1A of the first travel path 4A) which extends along the exit-side portion of the second diverging path 5B, a second entrance-side rail portion E1 (of the diverging-side rail portion 1A of the second travel path 4B) which extends along the entrance-side portion of the second diverging path 5B, and a second exit-side rail portion E2 (of the diverging-side rail portion 1A of the second travel path 4B) which extends along the exit-side portion of the first diverging path 5A.

The pair of movable rails 35 are configured to be able to change the arrangement of the movable rails 35 between the first diverging path forming state (see FIG. 10) in which the first movable rail 35a is in alignment with the first entrance-side rail portion D1 and extends along the first diverging path 5A and in the downstream direction of the path and in which the second movable rail 35b is in alignment with the second exit-side rail portion E2 and extends along the first diverging path 5A and in the upstream direction of the path, and the second diverging path forming state (see FIG. 8) in which one of the first movable rail 35a and the second movable rail 35b is in alignment with the second entrance-side rail portion E1 and extends along the second diverging path 5B and in the downstream direction of the path and in which the other of the first movable rail 35a and the second movable rail 35b is in alignment with the first exit-side rail portion D2 and extends along the second diverging path 5B and in the upstream direction of the path. In the present embodiment, the first movable rail 35a is in alignment with the second entrance-side rail portion E1 and the second movable rail 35b is in alignment with the first exit-side rail portion D2 in the second diverging path forming state.

Figure 8:
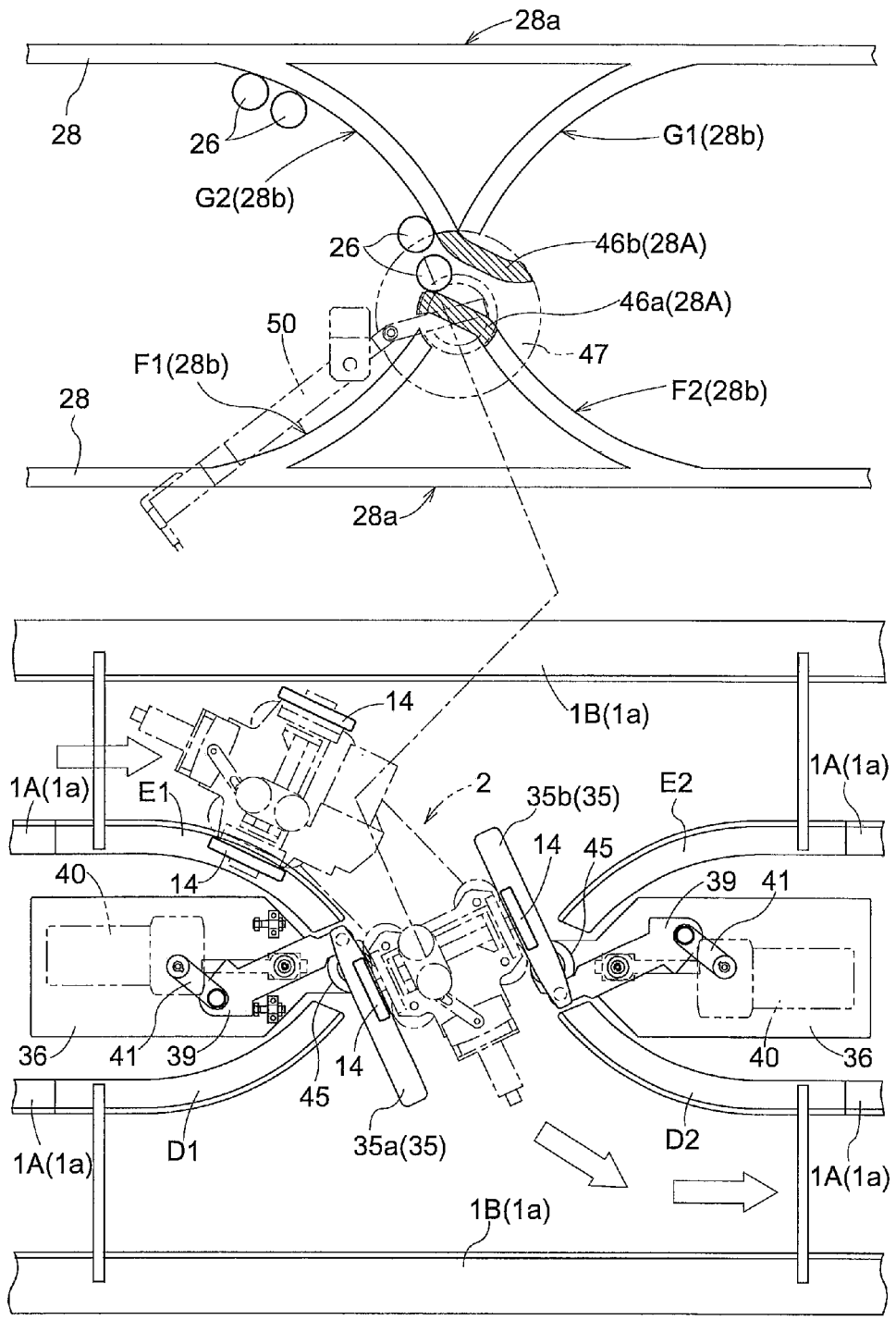
FIG. 8 is an explanatory drawing showing the second diverging travel state of the same location.
Figure 10:
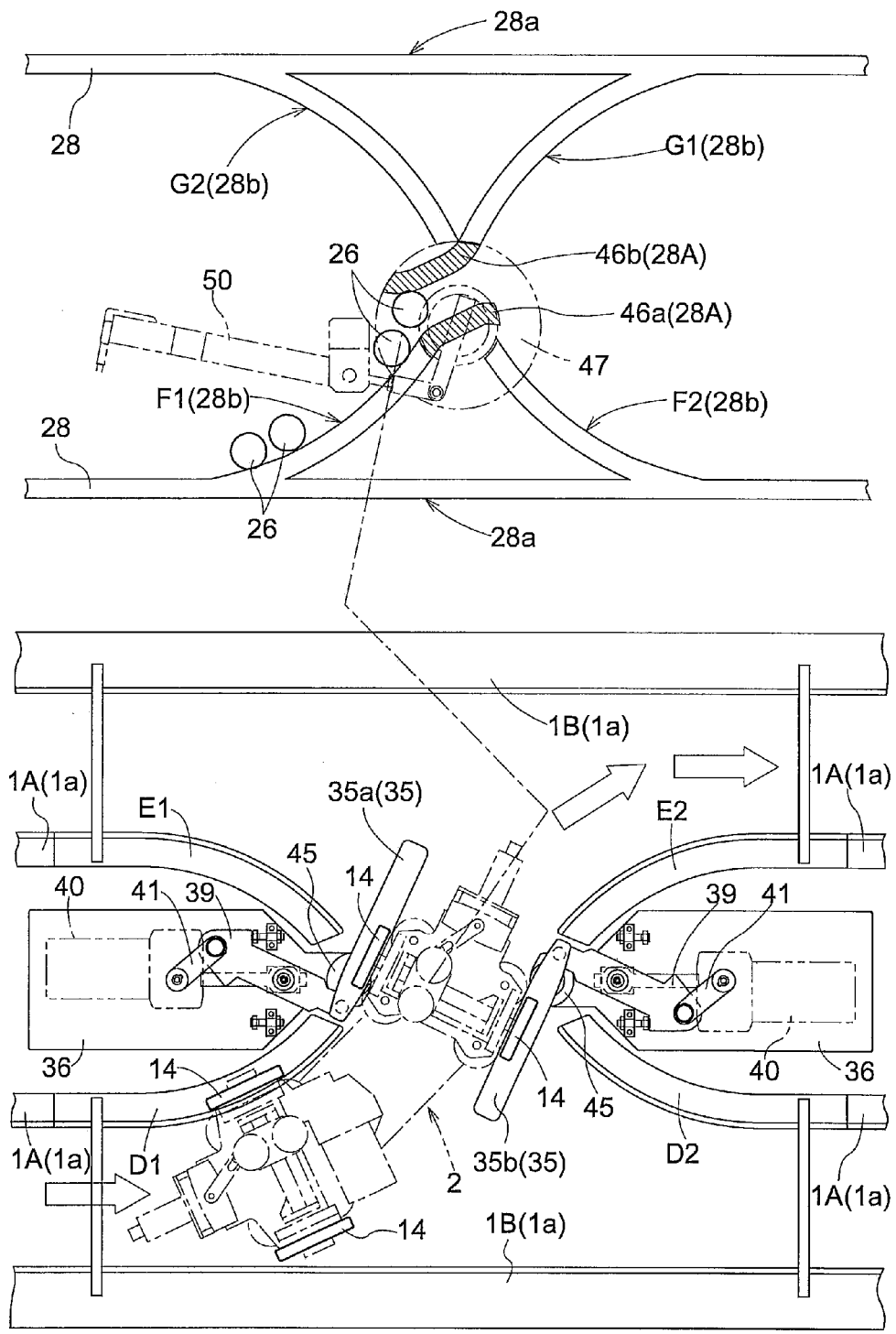
FIG. 10 is an explanatory drawing showing the first diverging travel state of the same location.

In other words, in the present embodiment, an auxiliary support mechanism, for receiving and supporting the article transport vehicle 2 at the location where the diverging-side rail portion 1A does not exist (non-existing area) in the first diverging path 5A or the second diverging path 5B, is configured such that the article transport vehicle 2 is received and supported by a pair of movable rails 35. And the pair of movable rails 35 are arranged and oriented in the first diverging path forming state such that they face, or are opposite, each other in the path lateral direction of the first diverging path 5A as shown in FIG. 10, and are oriented in the second diverging path forming state such that they face, or are opposite, each other in the path lateral direction of the second diverging path 5B as shown in FIG. 8.

To describe the movable rails 35 in more detail, as shown in FIGS. 5 and 7, elongate rail support frames 36 are provided in an area between the first entrance-side rail portions D1 and the second entrance-side rail portions E1, and in an area between the first exit-side rail portion D2 and the second exit-side rail portion E2, such that each rail support frame 36 extends along the longitudinal direction of the spaced-apart side rail portion 1B, and is suspend from and supported by the ceiling portion, or connected to and supported by respective diverging-side rail portion 1A.

Figure 11:
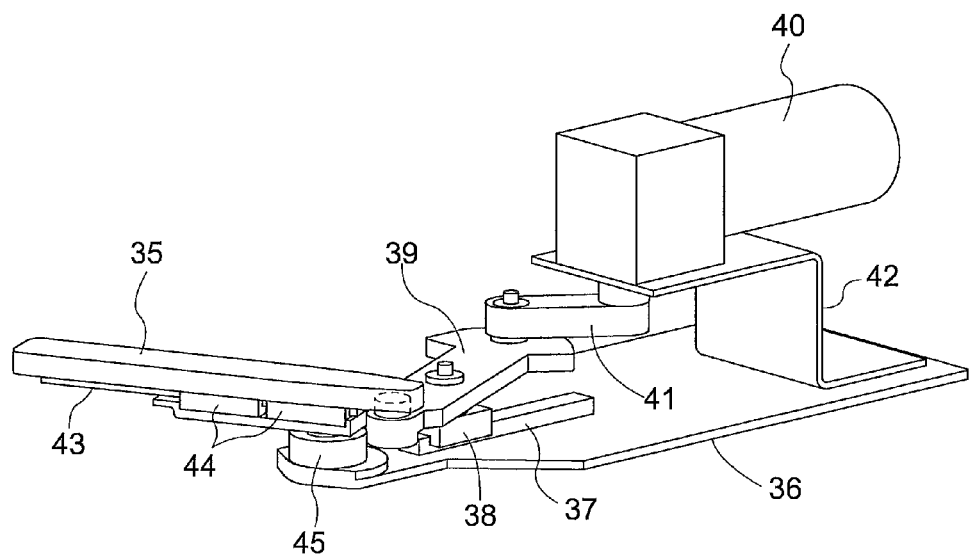
FIG. 11 is a perspective view showing an actuating mechanism for the movable rails.
Figure 12:
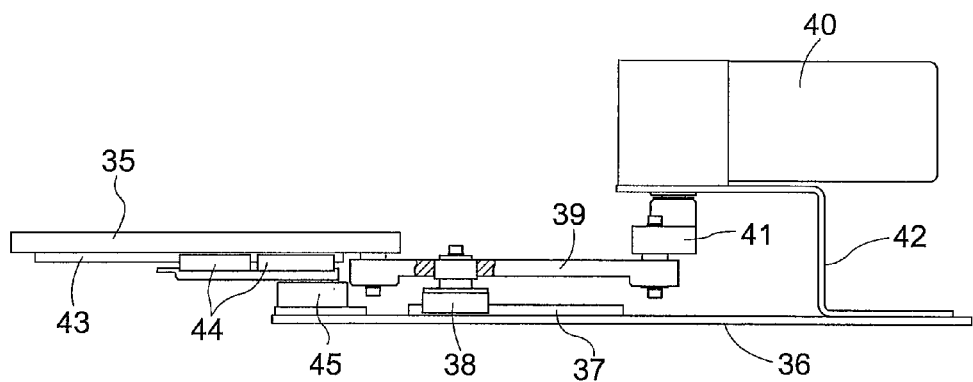
FIG. 12 is a partial cut-out side view showing the same mechanism that is shown in FIG. 11.

As shown in FIGS. 11 and 12, a first guide body 37 extending in a direction along the longitudinal direction of the spaced-apart side rail portion 1B is attached to the rail support frame 36. A first movable body 38 is guided and supported by the first guide body 37 such that the first movable body 38 can be moved along the longitudinal direction of the spaced-apart side rail portion 1B. An intermediate portion of a relay link 39 in the longitudinal direction is supported by the first movable body 38 such that the intermediate portion of a relay link 39 is pivotable about a vertical axis.

A distal end portion of a drive link 41 which is rotated by an electric motor 40 is pivotably connected to the end of the relay link 39 that is away from the movable rail 35 whereas the movable rail 35 is pivotably connected to the other end portion of the relay link 39.

The electric motor 40 is supported by the support bracket 42 attached to the rail support frame 36.

The movable rail 35 is formed in an elongate shape extending from the connecting portion with the relay link 39, and a second guide body 43 extending in the rail longitudinal direction is attached to the undersurface of the movable rail 35. A second movable body 44 which is movably guided and supported by the second guide body 43 is supported by a bearing 45 attached to the rail support frame 36 such that the second movable body 44 can rotate about a vertical axis.

Figure 9:
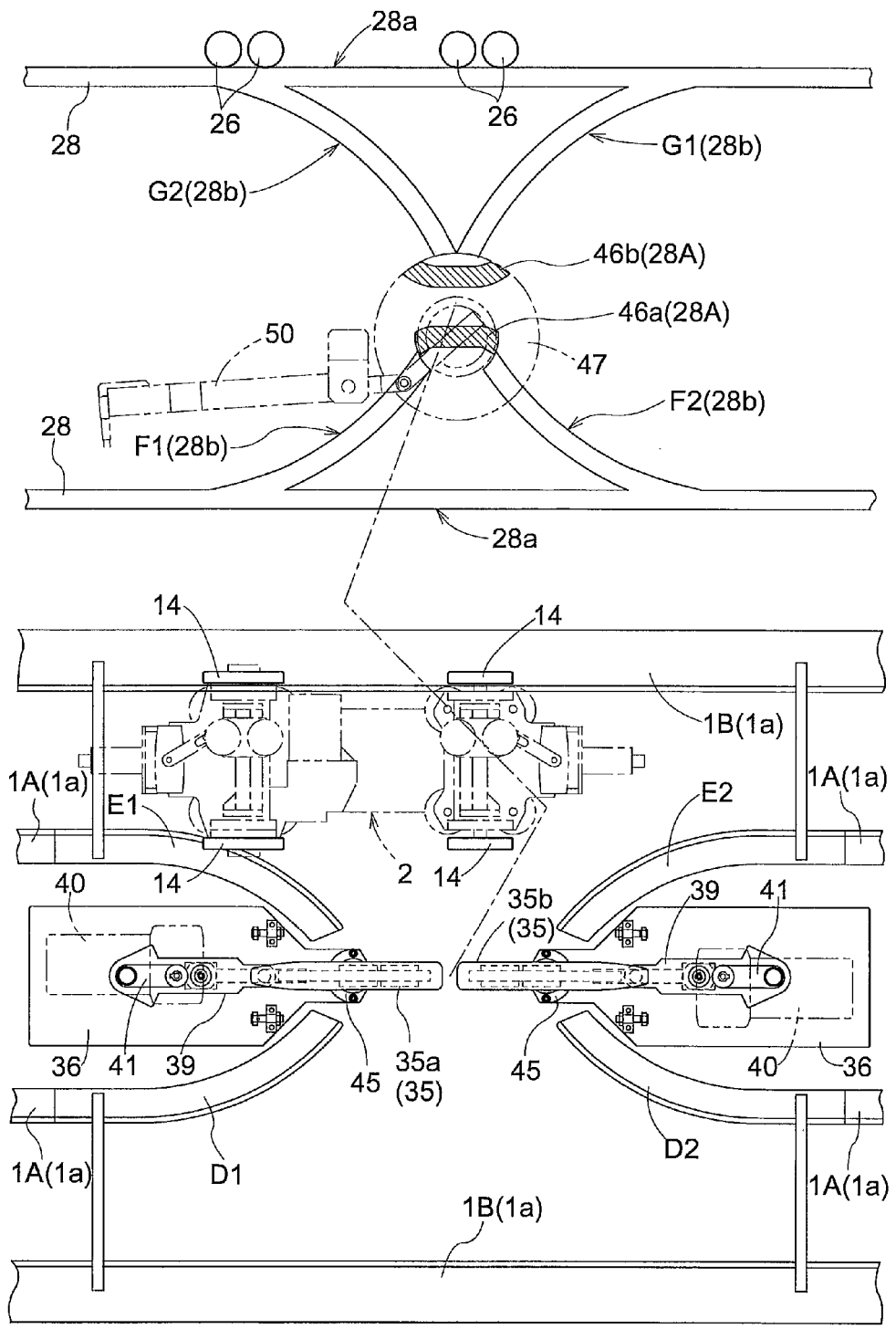
FIG. 9 is an explanatory drawing showing the non-diverging travel state of the same location.

Therefore, as the electric motor 40 (an example of an actuator) operates, the movable rail 35 is switched between the first diverging path forming state (see FIG. 10) and the second diverging path forming state (see FIG. 8) as the movable rail 35 is pivoted about the bearing 45 of the rail support frame 36 and is moved along the longitudinal direction of the spaced-apart side rail portion 1B. And as shown in FIGS. 7 and 9, the movable rail 35 is configured to be moved away from the other movable rail 35 to avoid contacting the other movable rail 35 when the movable rail 35 extends along the longitudinal direction of the spaced-apart side rail portion 1B.

As shown in FIG. 6, the upper guide rail 28 for contacting and guiding the guide wheels 26 has a non-diverging guide surface 28a for switching to a non-diverging travel state (straight-forward travel state) as well as a diverging guide surface 28b for switching to a diverging travel state.

And the guide surface switching mechanism 29 causes the positions of the guide wheels 26 to be changed in the vehicle body lateral direction by pivoting the pivot arm 31 with the actuator 30 in order to switch the guide surface for guiding the guide wheels 26 between the non-diverging guide surface 28a and the diverging guide surface 28b. As such, the guide surface switching mechanism 29 is configured to be able to switch the travel state of the article transport vehicle 2 between a state in which the article transport vehicle 2 traveling along the first travel path 4A or the second travel path 4B is caused to diverge into the first diverging path 5A or the second diverging path 5B (see FIG. 8 and FIG. 10) and a state in which the article transport vehicle 2 traveling along the first travel path 4A or the second travel path 4B is caused to travel straight forward without diverging (see FIG. 9).

Therefore, in the present embodiment, the travel direction change mechanism for switching between the diverging travel state in which the travel direction of the article transport vehicle 2 traveling along the first travel path 4A or the second travel path 4B is caused to diverge toward the first diverging path 5A or the second diverging path 5B and the non-diverging travel state in which the article transport vehicle 2 is caused to travel straight forward is configured to switch the travel state of the article transport vehicle 2 between the diverging travel state and the non-diverging travel state by switching the guided state of the guide wheel 26 between the state in which the guide wheels 26 are guided by the diverging guide surface 28b and the state in which the guide wheels 26 are guided by the non-diverging guide surface 28a.

As shown in FIG. 9, the non-diverging guide surface 28a of the upper guide rail 28 extends from the entrance portion to the exit portion of a diverging path forming area and contacts or receives the guide wheels 26 in the diverging path forming area in order to limit the article transport vehicle 2 from leaning toward the side of the diverging-side rail portion 1A.

In other words, the article transport vehicle 2 that travels along the first travel path 4A or the second travel path 4B without diverging in the diverging path forming area is supported only by the spaced-apart side rail portion 1B without being supported by the diverging-side rail portion 1A. When this happens, the guide wheels 26 are received and guided by the non-diverging guide surface 28a of the upper guide rail 28 to limit the article transport vehicle 2 from leaning toward the side of the diverging-side rail portion 1A.

Therefore, in the present embodiment, a non-diverging travel auxiliary guide mechanism for guiding the article transport vehicle 2 such as to limit the article transport vehicle 2 traveling in the diverging path forming area of the first travel path 4A or the second travel path 4B from leaning toward the side of the diverging-side rail portion 1A is configured to guide the article transport vehicle 2 while limiting the article transport vehicle 2 from leaning toward the side of the diverging-side rail portion 1A with the non-diverging guide surface 28a contacting and guiding the guide wheels 26.

As shown in FIG. 6, the upper guide rail 28 includes the first entrance-side diverging guide surface F1, the first exit-side diverging guide surface F2, the second exit-side diverging guide surface G1, and the second entrance-side diverging guide surface G2, as diverging guide surfaces 28b.

As shown in FIG. 10, the first entrance-side diverging guide surface F1 is a surface that contacts the guide wheels 26 to limit the travel portion 10 from leaning toward the side on which the travel wheels 14 are afloat (i.e. not in contact with any rail portion) when the travel portion 10 travels with the travel wheels 14 on one side among the right and left travel wheels 14 being placed on and in contact with the first entrance-side rail portion D1 and with the wheels on the other side being afloat.

The second exit-side diverging guide surface G1 is a surface that contacts the guide wheels 26 to limit the travel portion 10 from leaning toward the side on which the travel wheels are afloat when the travel portion 10 travels with the travel wheels 14 on one side among the right and left travel wheels 14 being placed on and in contact with the second exit-side rail portion E2 and with the wheels on the other side being afloat (see FIG. 10).

As shown in FIG. 8, the second entrance-side diverging guide surface G2 is a surface that contacts the guide wheels 26 to limit the travel portion 10 from leaning toward the side on which the travel wheels 14 are afloat when the travel portion 10 travels with the travel wheels 14 on one side among the right and left travel wheels 14 being placed on and in contact with the second entrance-side rail portion E1 and with the wheels on the other side being afloat.

The first exit-side diverging guide surface F2 is a surface that contacts the guide wheels 26 to limit the travel portion 10 from leaning toward the side on which the travel wheels are afloat when the travel portion 10 travels with the travel wheels 14 on one side among the right and left travel wheels 14 being placed on and in contact with the first exit-side rail portion D2 and with the travel wheels 14 on the other side among the right and left travel wheels 14 being afloat (see FIG. 8).

Therefore, in the present embodiment, a diverging travel auxiliary guide mechanism for providing the article transport vehicle 2 with a guiding action, in addition to the guiding action of the diverging-side rail portion 1A, is configured to guide the article transport vehicle 2 by receiving the guide wheels 26 with the first entrance-side diverging guide surface F1 and the second exit-side diverging guide surface G1 when the article transport vehicle 2 travels along the first diverging path 5A, and by receiving the guide wheels 26 with the second entrance-side diverging guide surface G2 and the first exit-side diverging guide surface F2 when the article transport vehicle 2 travels along the second diverging path 5B in order to limit the article transport vehicle 2, that travels along the first diverging path 5A or the second diverging path 5B, from leaning in the vehicle lateral direction.

An attitude changing portion 28A which is a part of portion that defines the diverging guide surface 28b in the upper guide rail 28 is configured to be able to change its position between a first state (see FIG. 10) in which the first entrance-side diverging guide surface F1 and the second exit-side diverging guide surface G1 overlap with each other in the longitudinal direction of the first diverging path 5A, and a second state (see FIG. 8) in which the second entrance-side diverging guide surface G2 and the first exit-side diverging guide surface F2 overlap each other in the longitudinal direction of the second diverging path 5B. That is, in the first state, the first entrance-side diverging guide surface F1 and the second exit-side diverging guide surface G1 have portions that are located at the same position in the longitudinal direction of the first diverging path 5A whereas in the second state, the second entrance-side diverging guide surface G2 and the first exit-side diverging guide surface F2 have portions that are located at the same position in the longitudinal direction of the second diverging path 5B.

That is, a first rail member 46a which defines the first entrance-side diverging guide surface F1 in the first state and which defines the first exit-side diverging guide surface F2 in the second state and a second rail member 46b which defines the second exit-side diverging guide surface G1 in the first state and which defines the second entrance-side diverging guide surface G2 in the second state are provided as the attitude changing portions 28A.

Figure 13:
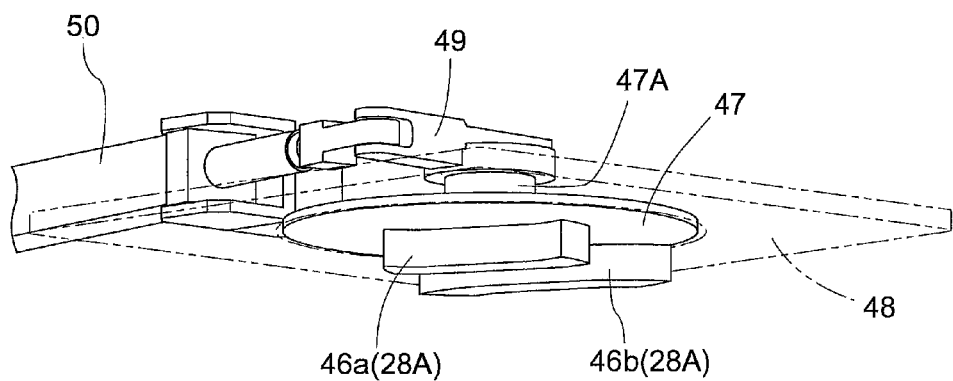
FIG. 13 is a perspective view showing an actuating mechanism for an attitude changing portion.
Figure 14:
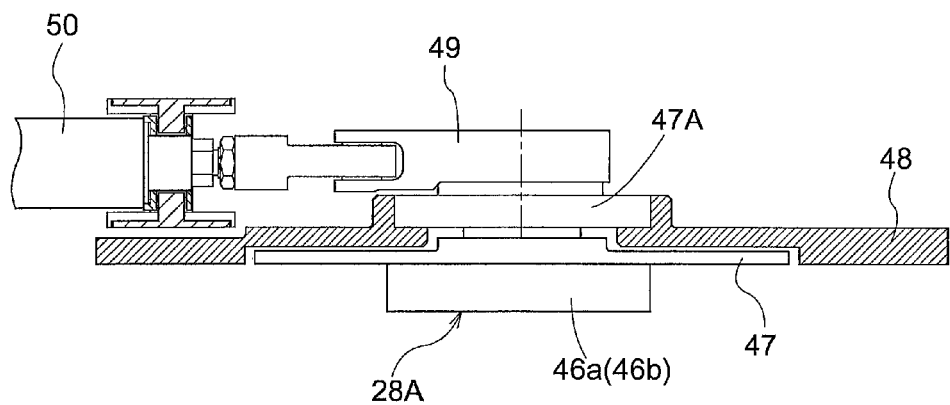
FIG. 14 is a partial cut-out side view showing the same mechanism that is shown in FIG. 13.

As shown in FIGS. 6 and 13, a shaft-shaped support 47A projects from an upper portion of a disk-shaped member 47 which supports the first rail member 46a and the second rail member 46b on its undersurface. And the disk-shaped member 47 is supported by a rectangular plate-shaped member 48 which is suspend from and supported by the ceiling portion such that the support 47A projects upwardly and such that the disk-shaped member 47 can be rotated about a vertical axis with respect to the rectangular plate-shaped member 48.

An operating arm 49 is attached to an upper portion of the support 47A. And an electrically actuated cylinder 50 for pivoting the operating arm 49 is provided.

Therefore, the attitude changing portion 28A is switched between the first state and the second state by rotating the disk-shaped member 47 with the electrically actuated cylinder 50 (an example of an actuator) to guide the guide wheels 26 precisely when the article transport vehicle 2 travels along the first diverging path 5A and the second diverging path 5B.

In other words, if the attitude changing portion 28A was not provided, the travel path of the guide wheels 26 when the article transport vehicle 2 travels along the first diverging path 5A and the travel path of the guide wheels 26 when the article transport vehicle 2 travels along the second diverging path 5B would intersect each other. Thus, a gap would be formed in the longitudinal direction of the first diverging path 5A between the first entrance-side diverging guide surface F1 and the second exit-side diverging guide surface G1. And a gap would be formed in the longitudinal direction of the second diverging path 5B between the second entrance-side diverging guide surface G2 and the first exit-side diverging guide surface F2.

In contrast, in the present embodiment, the attitude changing portion 28A is provided so that the first entrance-side diverging guide surface F1 and the second exit-side diverging guide surface G1 can be caused to overlap each other in the longitudinal direction of the first diverging path 5A when the article transport vehicle 2 travels along the first diverging path 5A and the second entrance-side diverging guide surface G2 and the first exit-side diverging guide surface F2 can be caused to overlap each other in the longitudinal direction of the second diverging path 5B when the article transport vehicle 2 travels along the second diverging path 5B; thus, the guide wheels 26 can be guided precisely.

Incidentally, when the article transport vehicle 2 travels along the first diverging path 5A, the guide wheels 26 that are guided by the first entrance-side diverging guide surface F1 are located in the left end side of its moving range in the vehicle body lateral direction. And when the guide wheels 26 reach a point where they are guided by the second exit-side diverging guide surface G1, the guide wheels 26 are moved to the right end side of the moving range in the vehicle body lateral direction due to a contact with the second exit-side diverging guide surface G1.

Also, when the article transport vehicle 2 travels along the second diverging path 5B, the guide wheel 26 that are guided by the second entrance-side diverging guide surface G2 are located in the right end side of the moving range in the vehicle body lateral direction. And when the guide wheels 26 reach a point where they are guided by the first exit-side diverging guide surface F2, the guide wheels 26 are moved to the left end side of the moving range in the vehicle body lateral direction due to a contact with the first exit-side diverging guide surface F2.

[Second Embodiment]

The second embodiment is described next. This second embodiment has a configuration that is similar to that in the first embodiment except that the configuration for operating the pair of movable rails 35 differs from that in the first embodiment.

Accordingly, in order to avoid duplicating the descriptions, only the configuration for operating the pair of movable rails 35 is described.

The second embodiment is identical to the first embodiment in that the first guide body 37 is attached to the rail support frame 36 and that the relay link 39 is supported by the first movable body 38 which is guided and supported by the first guide body 37. Also identical to the first embodiment is the fact that the second guide body 43 is provided in the undersurface of the movable rail 35, that the second movable body 44 which is movably guided and supported by the second guide body 43 is rotatably supported by the bearing 45 attached to the rail support frame 36, and that the direction or the orientation of the movable rail 35 is changed by pivoting the relay link 39.

Figure 15:
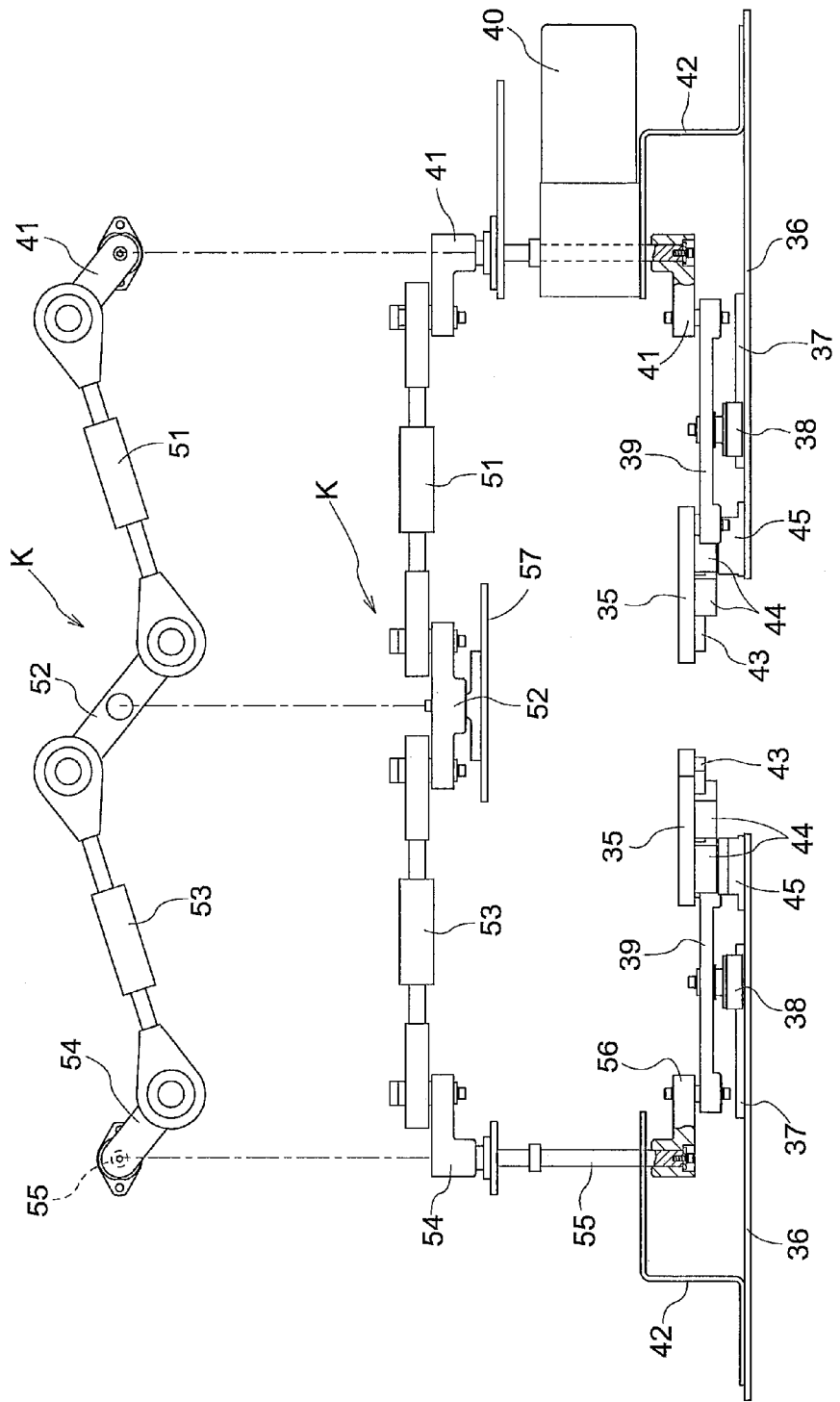
FIG. 15 is an explanatory drawing showing an actuating mechanism for the movable rails in accordance with the second embodiment.

As shown in FIG. 15, in the present embodiment, the pair of right and left movable rails 35 are configured to be operated by one electric motor 40.

That is, one electric motor 40 is provided in association with one of the pair of right and left movable rails 35 (referred to hereinafter as the subject movable rail 35). This electric motor 40 is provided with a pair of upper and lower drive links 41. The lower drive link 41 is pivotably connected to the end of the relay link 39 that is associated with the target movable rail 35, identically to the first embodiment.

And the upper drive link 41 of the upper and lower drive links 41 is operatively connected, through a link-type coordinating mechanism K, to the end of the relay link 39 that is associated with the other movable rail 35 that is different from the target movable rail 35.

The coordinating mechanism K includes a first rod 51 pivotably connected to the drive link 41, a relay pivot link 52 whose one end portion is pivotably connected to the first rod 51, a second rod 53 pivotably connected to the other end portion of the relay pivot link 52, a first pivot link 54 pivotably connected to the second rod 53, a rotating shaft 55 which has the first pivot link 54 attached to its upper end, and a second pivot link 56 attached to the lower end portion of the rotating shaft 55. And the second pivot link 56 is pivotably connected to the end of the relay link 39 associated with the other movable rail 35 that is different in the target movable rail 35.

Note that a longitudinally intermediate portion of the relay pivot link 52 is rotatably supported by a support frame 57. The support frame 57 may be suspended from and supported by the ceiling portion or may be provided in any other manner.

Therefore, in the present embodiment, the pair of right and left movable rails 35 can be switched between the first diverging path forming state (see FIG. 10) and the second diverging path forming state (see FIG. 8) by means of one electric motor 40 (an example of an actuator).

[Third Embodiment]

The third embodiment is described next. This third embodiment has the configuration that is identical to that of the first embodiment except that the configuration of the pair of movable rails 35 is different, that the configuration of the attitude changing portion 28A in the upper guide rail 28 is different, and that the configurations for operation of the pair of movable rails 35 and the attitude changing portion 28A of the upper guide rail 28 are different.

Therefore, in order to avoid duplicating the descriptions, only the features that are different from those in the first embodiment are described below, and description of the features that are identical to those in the first embodiment are omitted.

Figure 19:
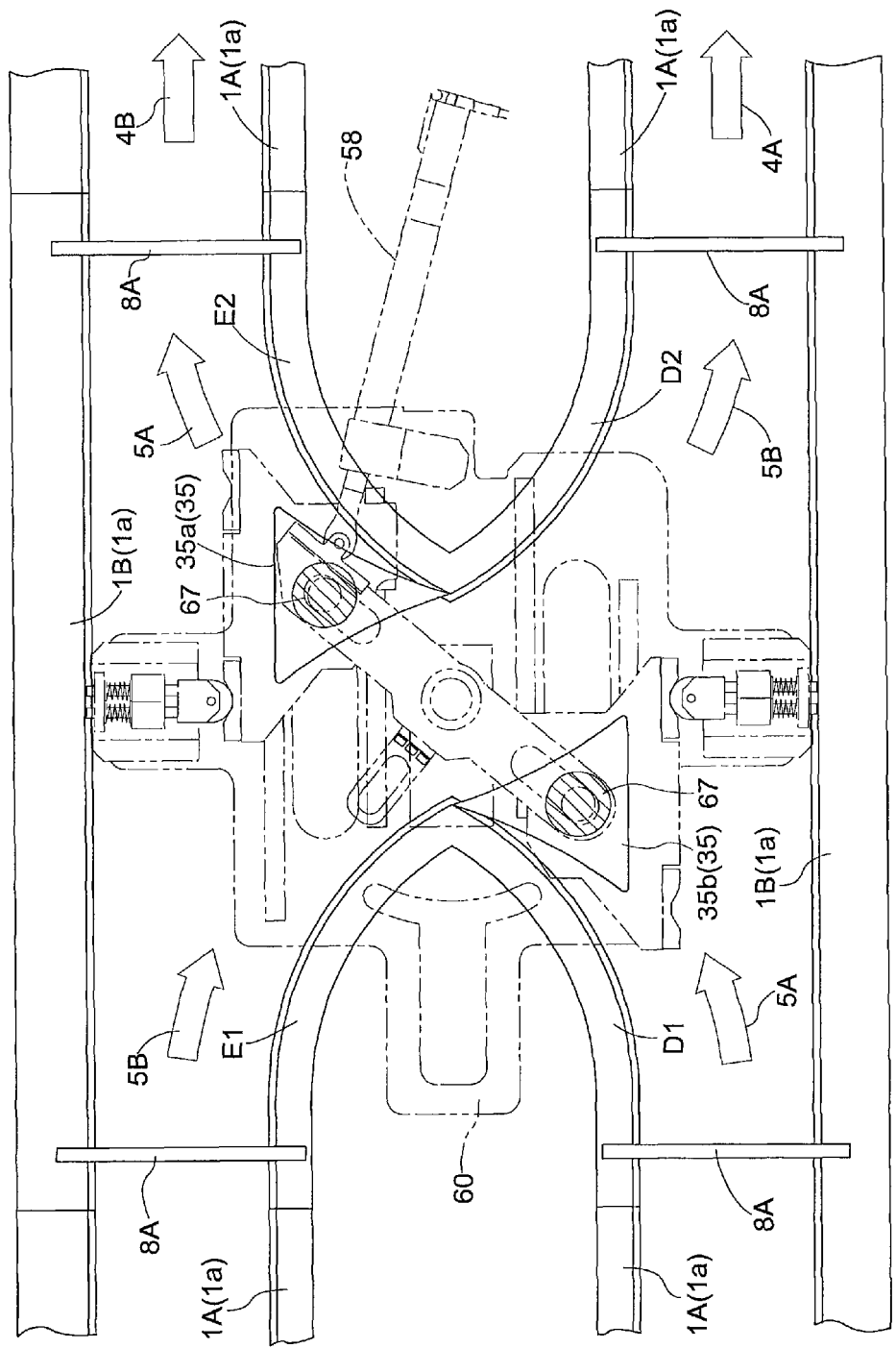
FIG. 19 is a plan view showing the guide rails at the same location.
Figure 21:
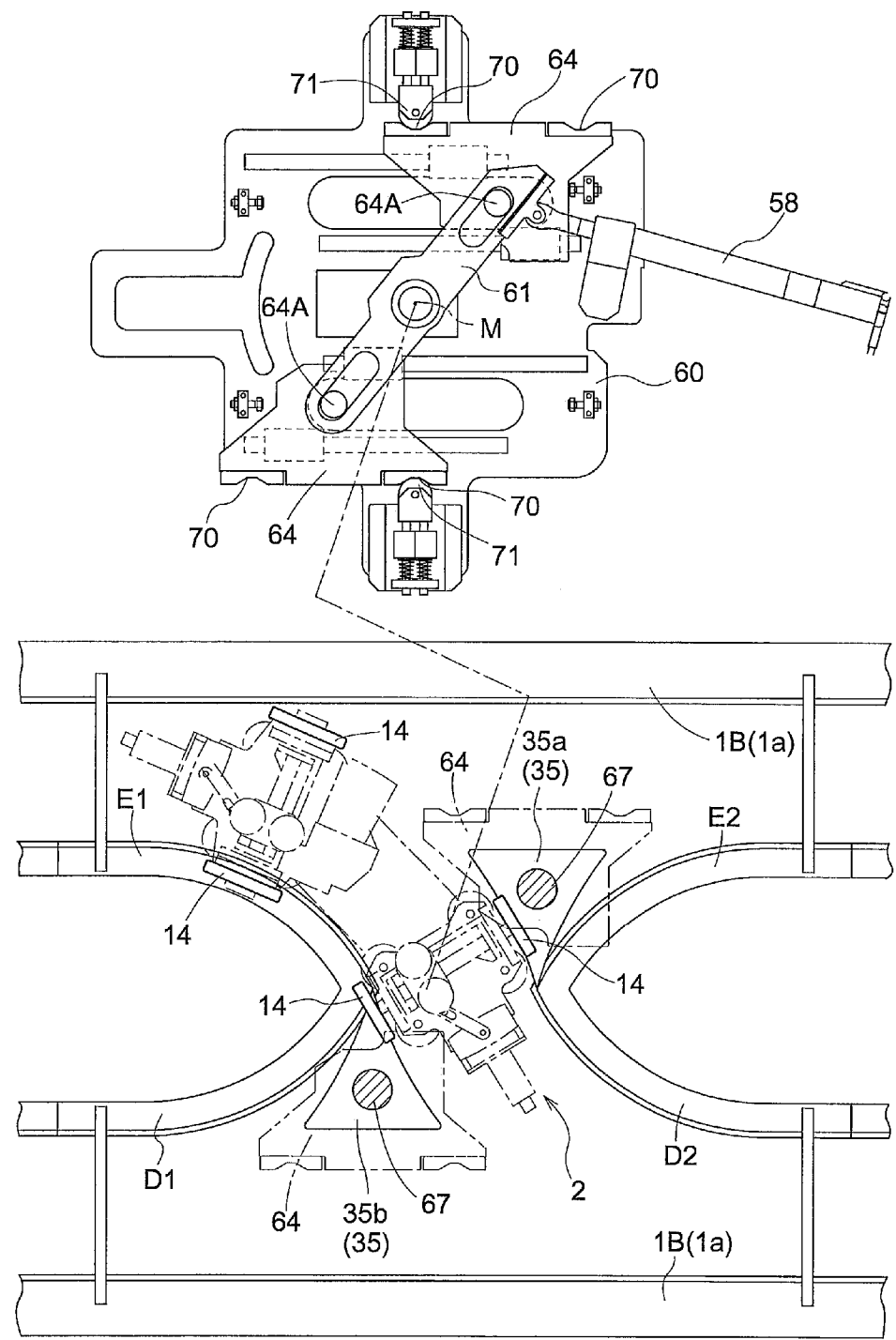
FIG. 21 is a plan view showing the movable rail in the second diverging travel state.
Figure 23:
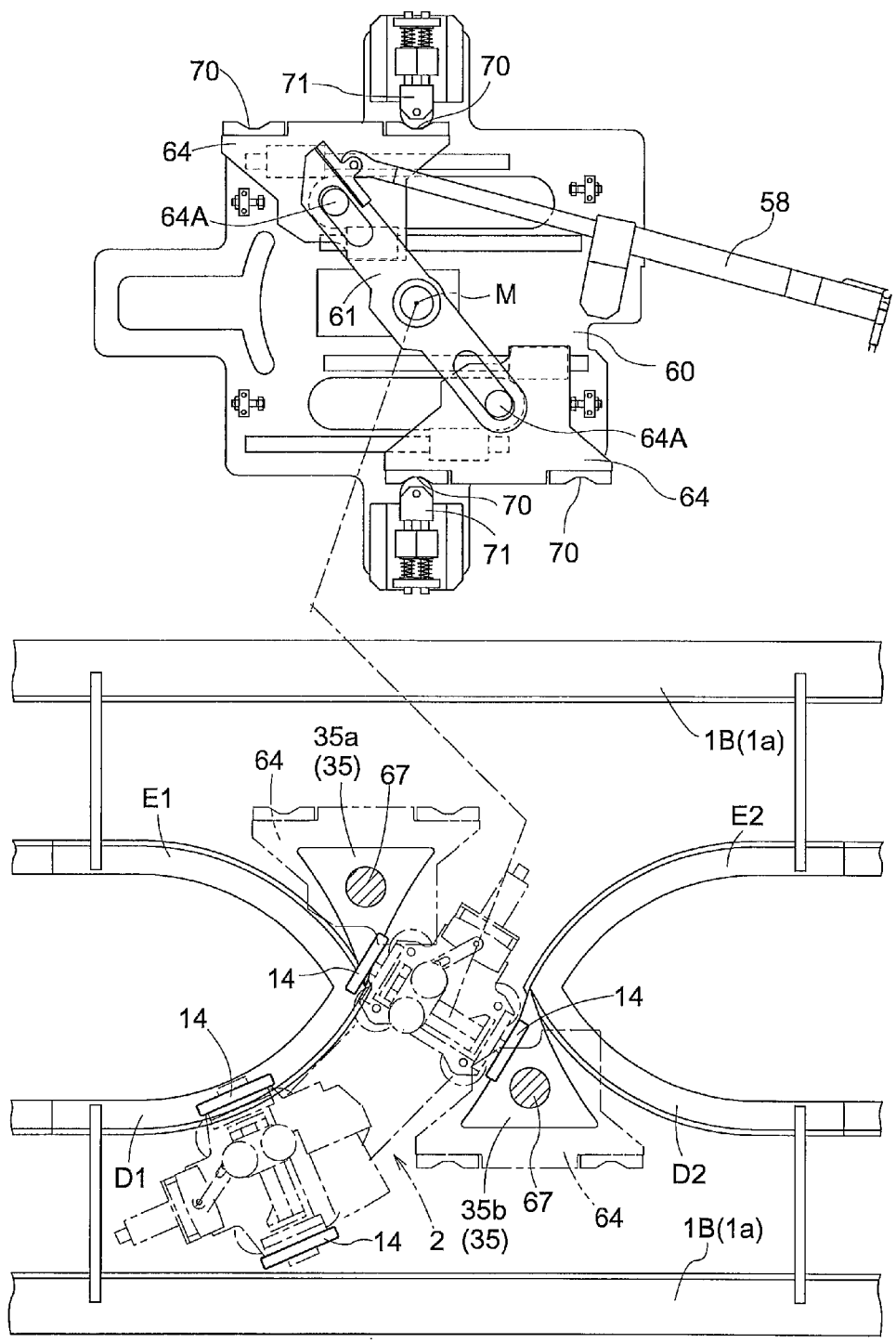
FIG. 23 is a plan view showing the movable rail in the first diverging travel state.

The third embodiment is identical to the first embodiment in that the pair of movable rails 35 are configured to be able to change the arrangement of the movable rails 35 between the first diverging path forming state (see FIG. 23) in which the first movable rail 35a is in alignment with the first entrance-side rail portion D1 and extends downstream along the first diverging path 5A and in which the second movable rail 35*b* is in alignment with the second exit-side rail portion E2 and extends upstream along the first diverging path 5A, and the second diverging path forming state (see FIGS. 19, 21) in which one of the first movable rail 35*a* and the second movable rail 35*b* is in alignment with the second entrance-side rail portion E1 and extends downstream along the second diverging path 5B and in which the other of the first movable rail 35*a* and the second movable rail 35*b* is in alignment with the first exit-side rail portion D2 and extends upstream along the second diverging path 5B. However, the present embodiment is different from the first embodiment in that, in the second diverging path forming state, the second movable rail 35*b* is arranged to be in alignment with the second entrance-side rail portions E1 and the first movable rail 35*a* is arranged to be in alignment with the first exit-side rail portion D2.

In this embodiment, the pair of movable rails 35 are formed such that each has a triangular shape in plan view, and are configured to be switched to the first diverging path forming state and the second diverging path forming state by slidingly moving the movable rails 35 along the longitudinal direction of the spaced-apart side rail portions 1B.

Incidentally, in this embodiment, in addition to the fact that there is a section in which the right and left travel wheels 14 are simultaneously placed on, or in contact with, the pair of movable rails 35 in the first diverging path forming state, there is a section in which the right and left travel wheels 14 are simultaneously placed on, or in contact with, one of the movable rails 35 (second movable rail 35*b*) and the first entrance-side rail portion D1 as well as a section in which the right and left travel wheels 14 are simultaneously placed on the other of the movable rails 35 (first movable rail 35*a*) and the second exit-side rail portion E2 in the first diverging path forming state so that there are longer sections in which the right and left travel wheels 14 are simultaneously placed on, or in contact with, the rails.

Similarly, in addition to the fact that there is a section in which the right and left travel wheels 14 are simultaneously placed on, or in contact with, the pair of movable rails 35 in the second diverging path forming state, there is a section in which the right and left travel wheels 14 are simultaneously placed on, or in contact with, one of the movable rails 35 (first movable rail 35*a*) and the second entrance-side rail portion E1 as well as a section in which the right and left travel wheels 14 are simultaneously placed on the other of the movable rails 35 (second movable rail 35*b*) and the first exit-side rail portion D2 in the second diverging path forming state so that there are longer sections in which the right and left travel wheels 14 are simultaneously placed on, or in contact with, the rails.

Figure 18:
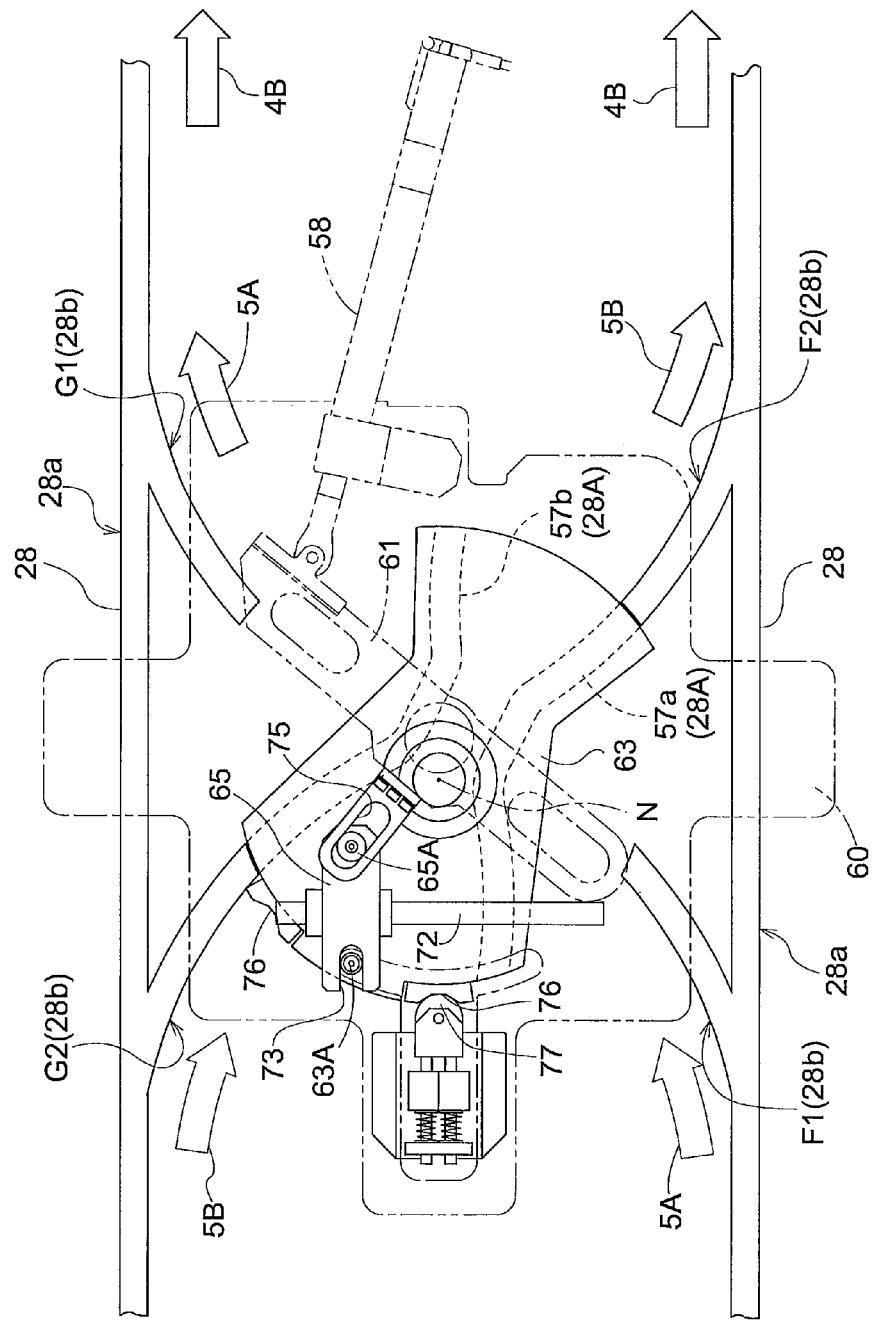
FIG. 18 is a plan view showing the upper guide rail at the same location.
Figure 20:
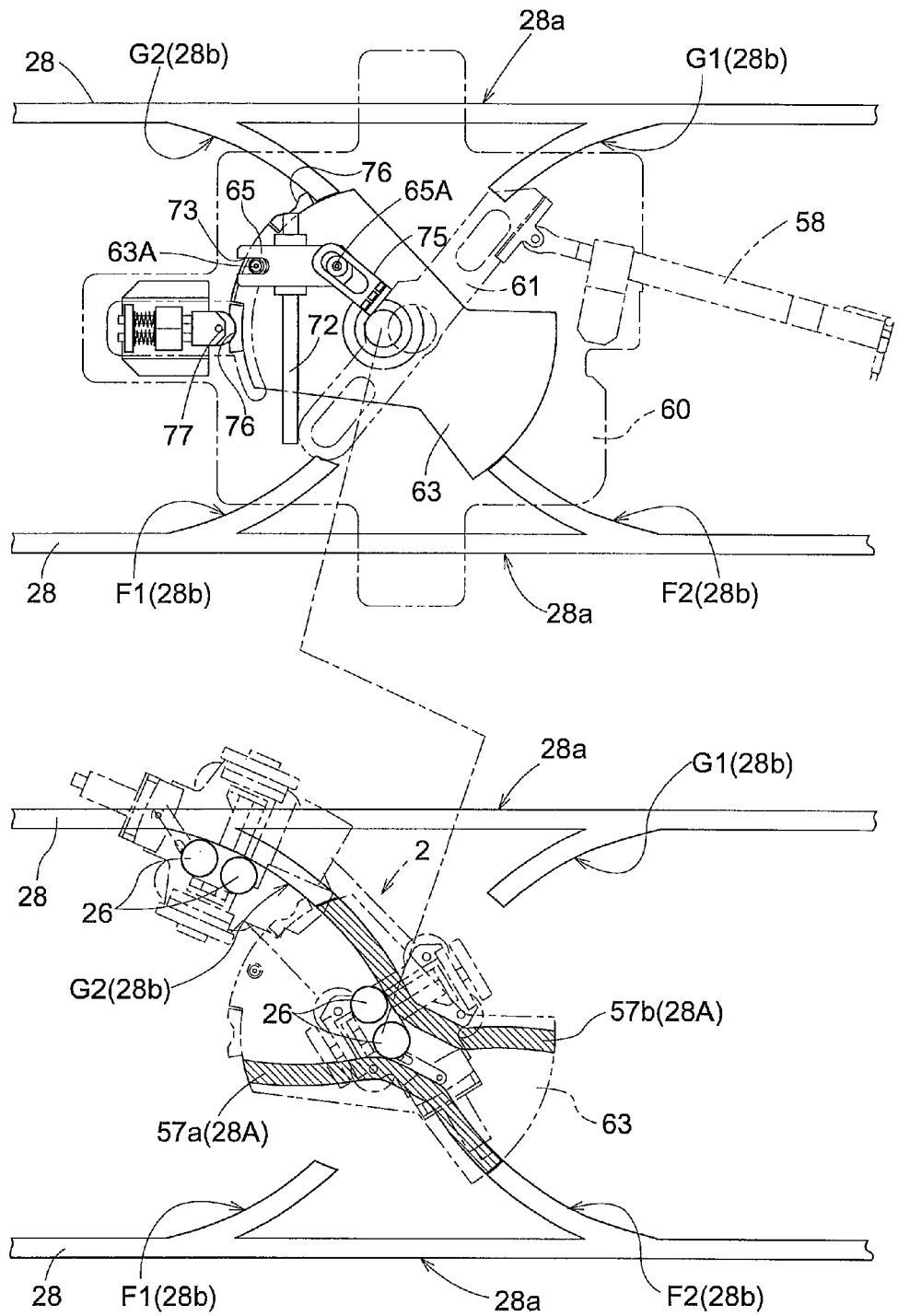
FIG. 20 is a plan view showing the attitude changing portion in the second diverging travel state.
Figure 22:
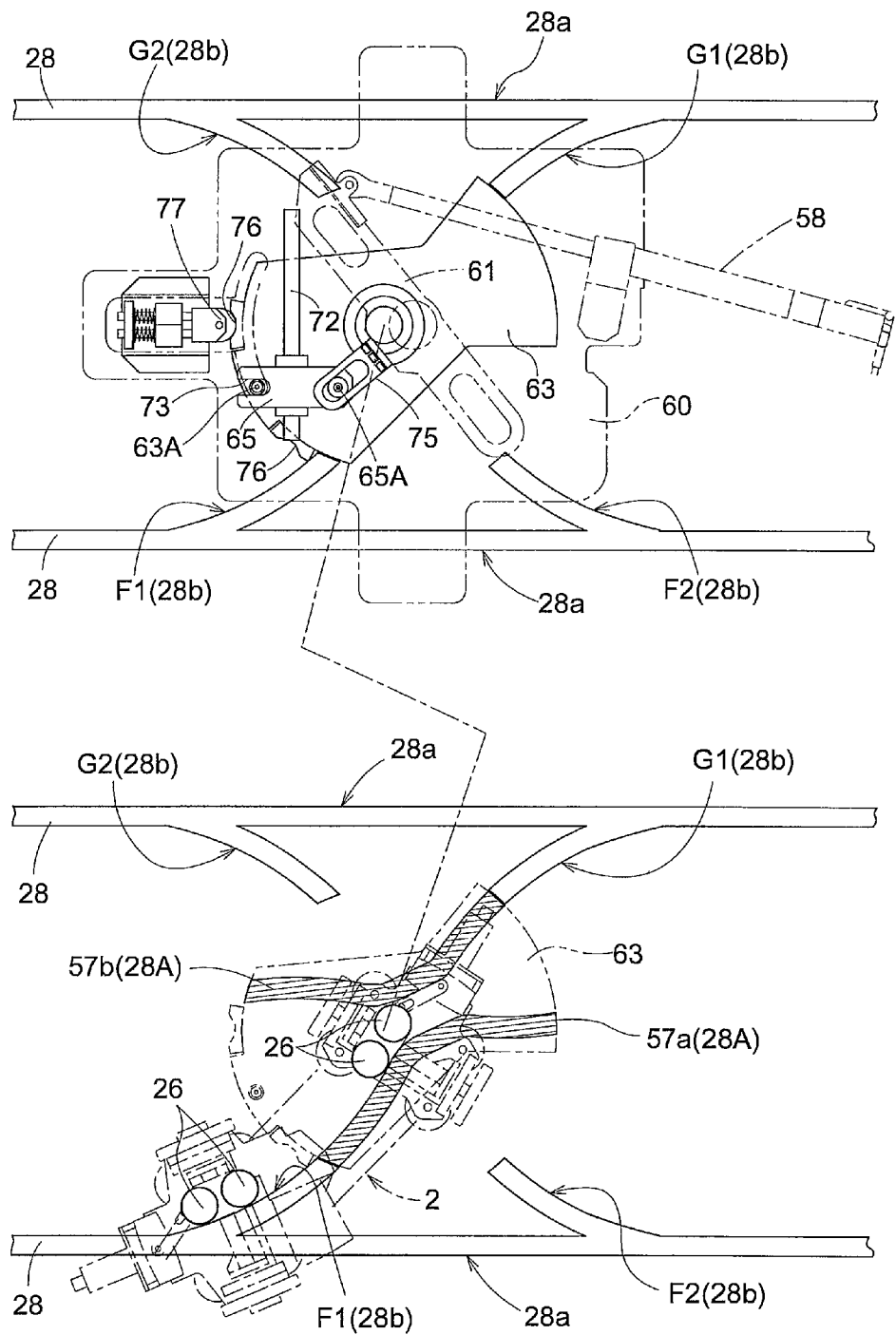
FIG. 22 is a plan view showing the attitude changing portion in the first diverging travel state.

As shown in FIGS. 18, 20, and 22, provided as the attitude changing portion 28A of the upper guide rail 28 are a first rail member 57*a* which forms the first entrance-side diverging guide surface F1 in the first state and which forms the first exit-side diverging guide surface F2 in the second state, and a second rail member 57*b* which forms the second exit-side diverging guide surface G1 in the first state and which forms the second entrance-side diverging guide surface G2 in the second state.

In the first embodiment, the lengths of the first rail member 46*a* and the second rail member 46*b* are different from each other. And they are switched between the first state and the second state by rotating them about a location of the first rail member 46*a* with shorter length. In contrast, in this third embodiment, the lengths of the first rail member 57*a* and the second rail member 57*b* are identical. And they are configured to be switched between the first state and the second state by rotating them about an intermediate location between the two rail members 57*a*, 57*b*.

In addition, in this embodiment, an electrically actuated cylinder 58 which functions as a single actuator is operatively connected with the pair of movable rails 35 and with the attitude changing portion 28A to switch between a first diverging state in which the pair of movable rails 35 are in the first diverging path forming state and in which the attitude changing portion 28A is in the first state and a second diverging state in which the pair of movable rails 35 are in the second diverging path forming state and in which the attitude changing portion 28A is in the second state.

Figure 16:
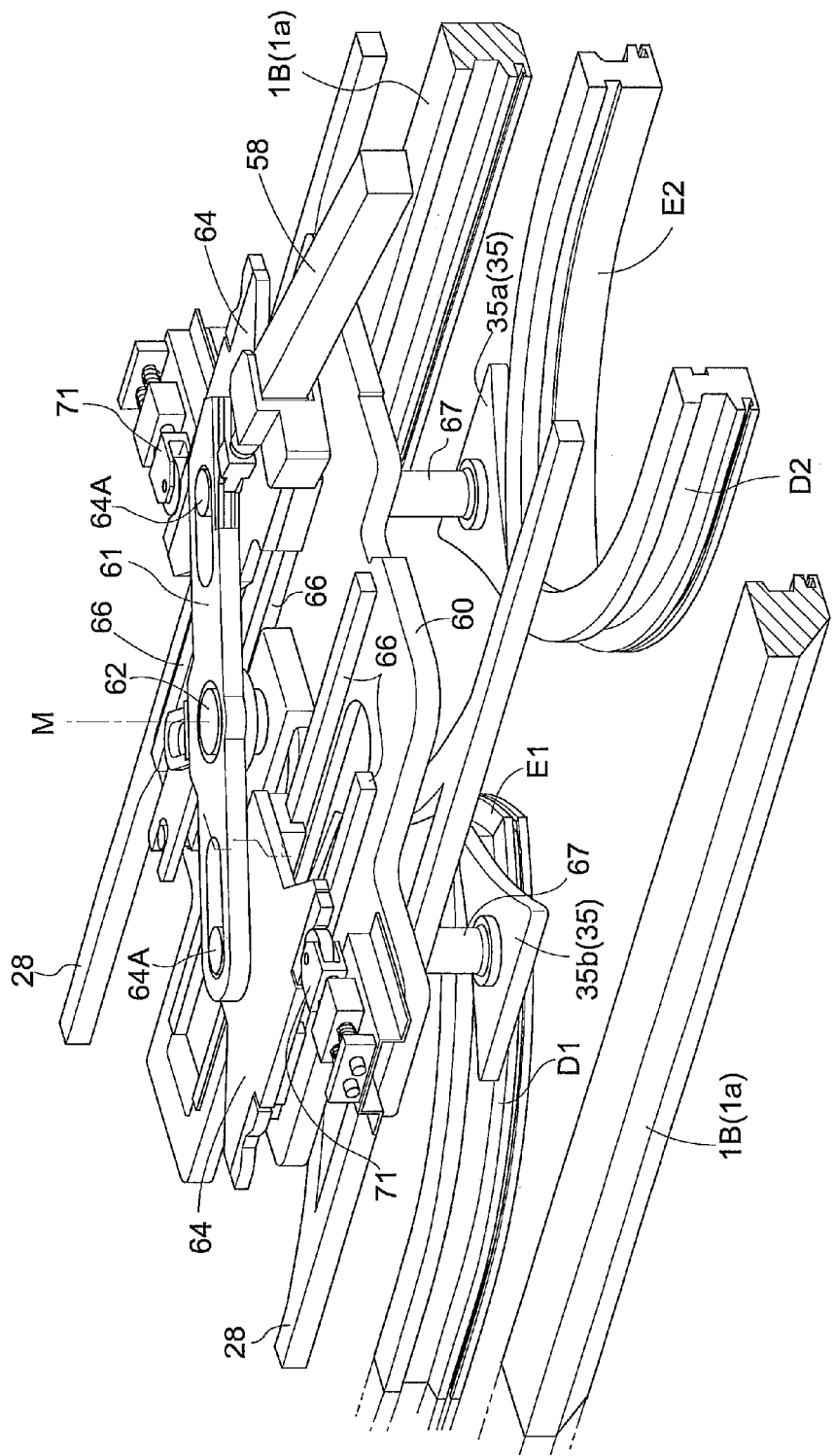
FIG. 16 is a perspective view of an X-shaped diverging location in accordance with the third embodiment.
Figure 25:
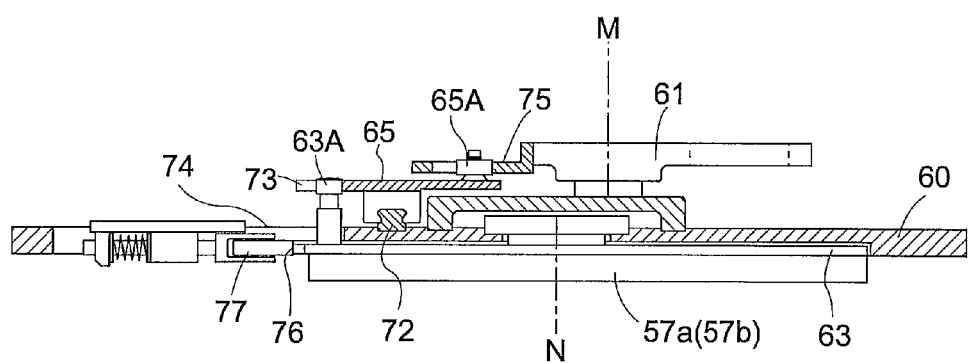
FIG. 25 is a partial cut-out side view showing the same mechanism that is shown in FIG. 24.

To describe in more detail, as shown in FIGS. 16 and 25, a plate-shaped base frame 60 is provided at a location upward of the upper guide rail 28 such that the base frame 60 is supported by the frame 8A (see FIG. 3) that supports the upper guide rail 28, or is suspended and supported by the ceiling portion, or is otherwise supported by any other conventional means. A T-shaped pivot frame 61, which can be rotated in a forward direction and its opposite direction by an electrically actuated cylinder 58 around an axis of rotation M, is provided at a location on, or upward of, this base frame 60 so that it is supported by a support shaft 62.

As shown in FIG. 25, a plate-shaped rail support body 63, to which the first rail member 57*a* and the second rail member 57*b* are attached, is supported by an undersurface portion of the base frame 60 such that the rail support body 63 is pivotable in the forward direction and the opposite direction about the axis of rotation N. And the attitude changing portion 28A is switched between the first state and the second state by the rotation of this rail support body 63.

Figure 17:
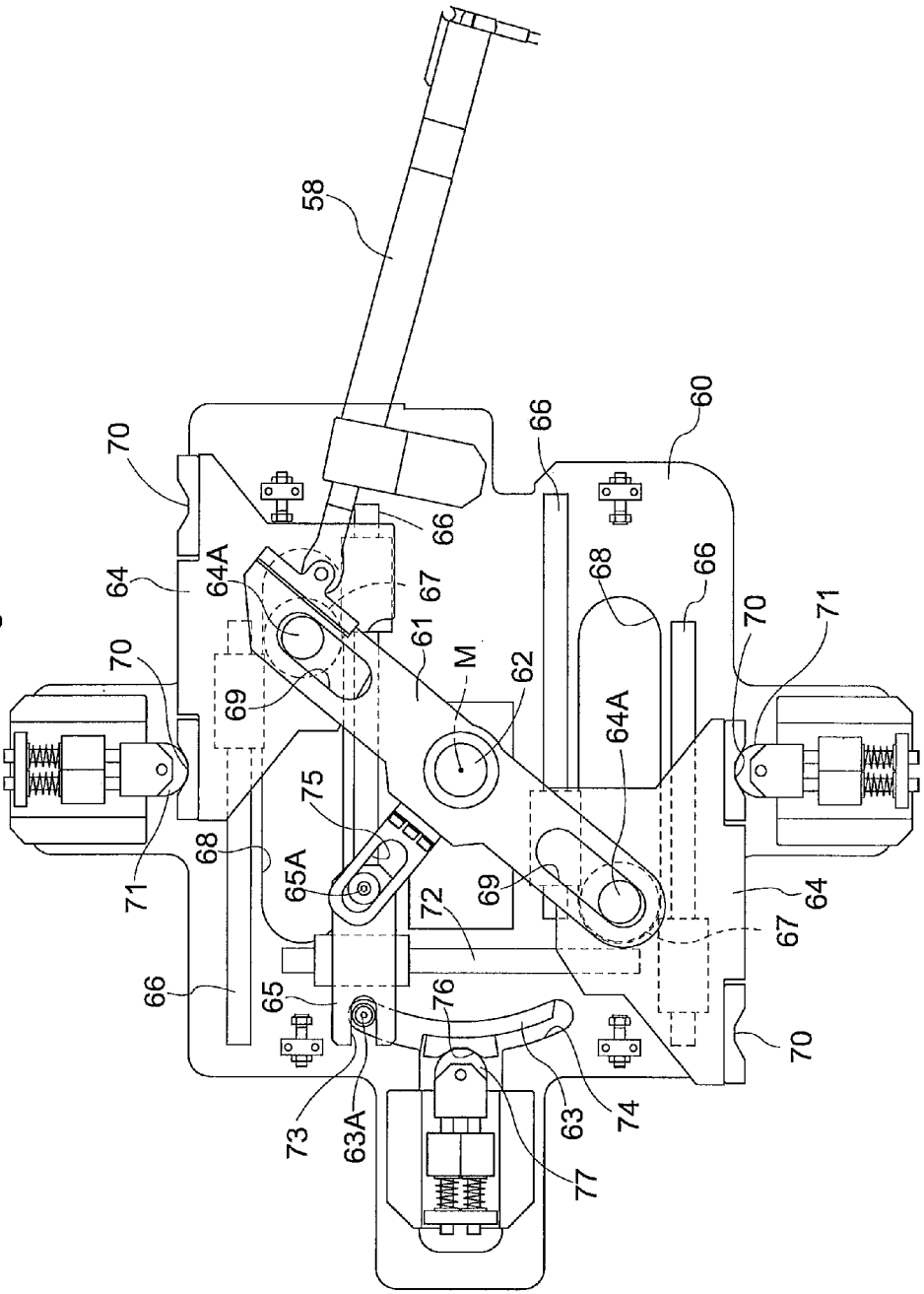
FIG. 17 is a plan view showing a fitting portion of a base frame at the same location.

As shown in FIGS. 16 and 17, a pair of right and left movable rail slide members 64, and an attitude changing portion slide member 65 are provided between the base frame 60 and the pivot frame 61.

Figure 26:
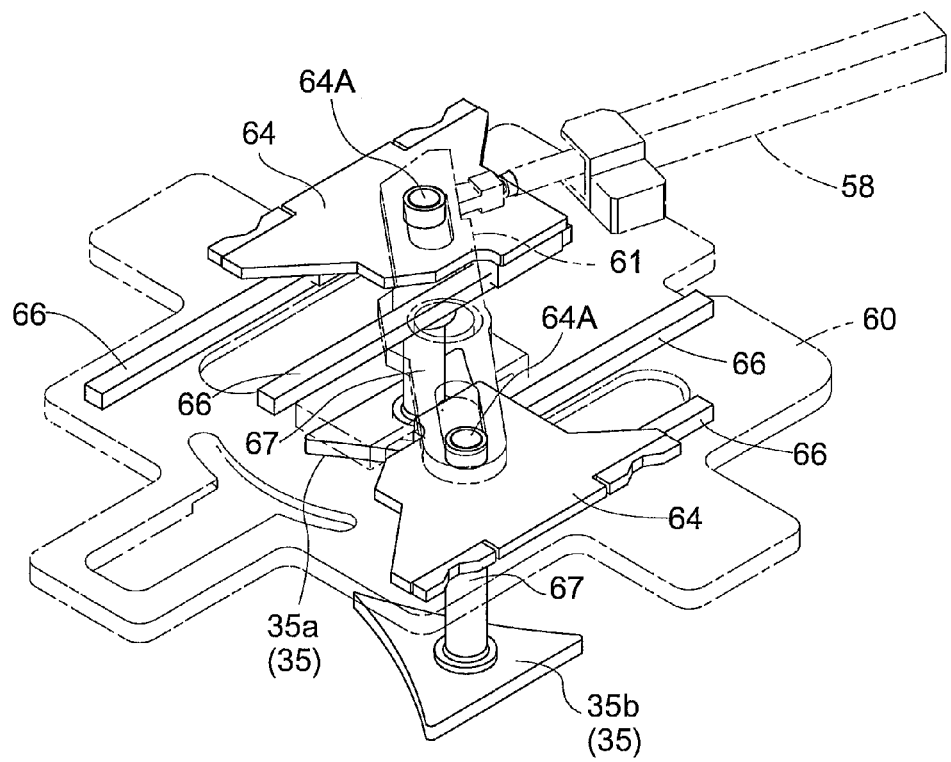
FIG. 26 is a perspective view showing the actuating mechanism for the movable rails.
Figure 27:
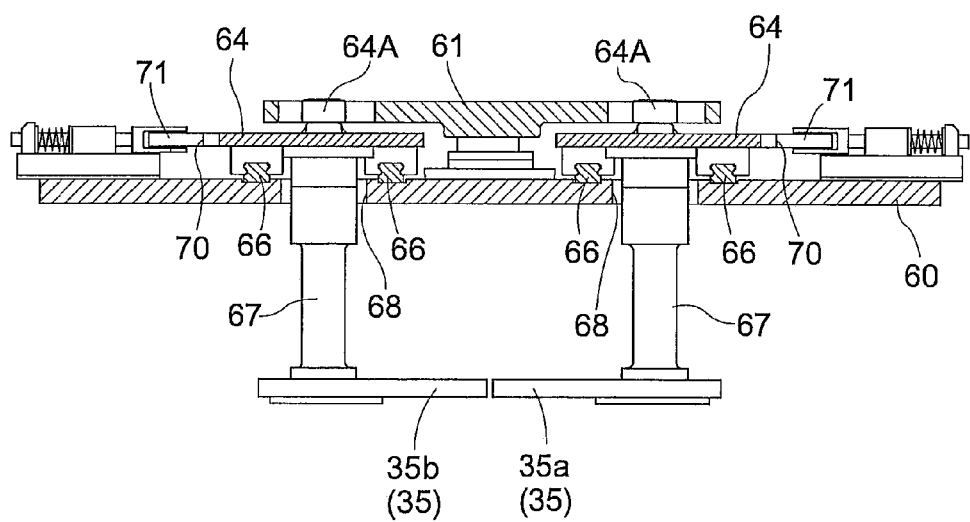
FIG. 27 is a partial cut-out side view showing the same mechanism that is shown in FIG. 26.

As shown in FIGS. 26 and 27, each of the pair of right and left movable rail slide members 64 is supported by a pair of right and left guide bodies 66 attached to the top surface portion of the base frame 60 such that the movable rail slide members 64 are slidable along the longitudinal direction of the spaced-apart side rail portion 1B. A shaft-shaped frame 67 is provided to each movable rail slide member 64 at a location between the right and left guide bodies 66 such that the shaft-shaped frame 67 projects downwardly from the movable rail slide member 64.

As shown in FIG. 17, each shaft-shaped frame 67 extends to below the base frame 60 through a long insertion hole 68 formed in the base frame 60 such that the insertion hole 68 extends along the longitudinal direction of the spaced-apart side rail portion 1B. Respective one of the movable rails 35 is attached to the lower end portion of each shaft-shaped frame 67.

An engaged portion 64A for sliding operation is provided at an upper portion of each movable rail slide member 64 such that the engaged portion 64A projects upwardly. And this engaged portion 64A is in engagement with a long engagement hole 69 formed in the pivot frame 61. And the movable rails 35 are configured to be switched between the first diverging path forming state and the second diverging path forming state by the pivoting of the pivot frame 61 in the forward direction and the opposite direction.

Note that elastic engaging bodies 71 are provided to the base frame 60 for positioning the movable rail slide members 64 by engaging a pair of engaging recess portions 70 formed in each movable rail slide member 64 by elastic urging force, when the movable rails 35 are in the first diverging path forming state and in the second diverging path forming state. Thus, the movable rails 35 are held in position precisely in the first diverging path forming state and in the second diverging path forming state.

Figure 24:
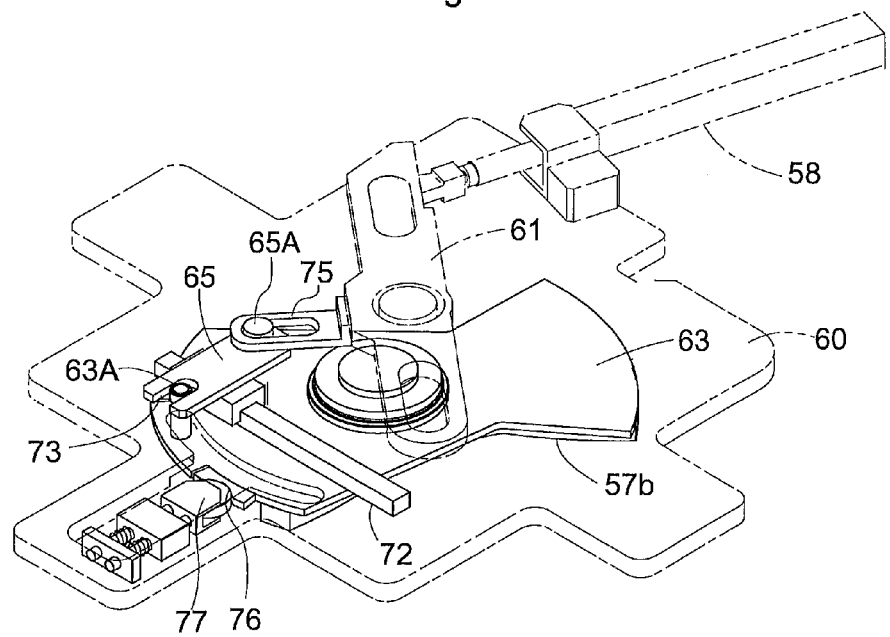
FIG. 24 is a perspective view showing an actuating mechanism for the attitude changing portion.

The attitude changing portion slide member 65 is supported by the guide body 72 attached to the top surface portion of the base frame 60 such that the attitude changing portion slide member 65 can slide in the direction perpendicular to the longitudinal direction of the spaced-apart side rail portion 1B. As shown in FIGS. 24 and 25, an engaging hole 73 with which the engaged body 63A engages is formed in one end portion of the attitude changing portion slide member 65 such that the engaging hole 73 is a U-shaped hole or recess that extends inwardly from the one end portion.

The engaged body 63A is provided such that it projects upwardly from the rail support body 63 and to above the base frame 60 through an insertion hole 74 formed in the base frame 60, as shown in FIG. 17.

As shown in FIGS. 17 and 24, an engaged portion 65A for sliding operation is provided in the other end portion of the attitude changing portion slide member 65 such that the engaged portion 65A projects upwardly. And this engaged portion 65A engages a long engaging hole 75 formed in the pivot frame 61. And the attitude changing portion 28A is configured to be switched between the first state and the second state by the pivoting of the pivot frame 61 in the forward direction and the opposite direction.

As shown in FIG. 18, an elastic engaging body 77 is provided in the base frame 60 for positioning the movable rail slide member 64 by engaging a pair of engaging recess portions 76 formed in the rail support body 63 by elastic urging force when the attitude changing portion 28A is in the first state and in the second state. Thus, the attitude changing portion 28A is held in position precisely in the first state and in the second state.

As described above, in the present embodiment, the diverging state can be switched between the first diverging state (see FIGS. 22 and 23) in which the pair of movable rails 35 are in the first diverging path forming state and in which the attitude changing portion 28A is in the first state and the second diverging state (see FIGS. 20 and 21) in which the pair of movable rails 35 are in the second diverging path forming state and in which the attitude changing portion 28A is in the second state by pivoting the pivot frame 61 in the forward direction and the opposite direction by means of the one electrically actuated cylinder 58.

[Alternative Embodiments]

Other alternative embodiments are described next. (1) In the first to the third embodiments, examples are described in which the travel portion 10 of the article transport vehicle 2 is divided into the front travel portion 10F and the back travel portion 10R. However, the travel portion 10 does not have to be divided.

(2) In the first to the third embodiments, examples are described in which the proper attitude of the article transport vehicle 2 is maintained by means of the movable rails 35 and the upper guide rail 28 in addition to the guide rail 1 during its travel when switching to the non-diverging travel state, the first diverging travel state, and the second diverging travel state. Any of various configurations may be utilized as the configuration for switching to and among the non-diverging travel configuration, the first diverging travel configuration, and the second diverging travel configuration. For example, a rail body for non-diverging travel configuration including a pair of right and left rail portions 1a for guiding the right and left travel wheels 14 of the travel portion 10 in the non-diverging travel configuration, a rail body for the first diverging travel configuration including a pair of right and left rail portions 1a for guiding the right and left travel wheels 14 of the travel portion 10 in the first diverging travel configuration, and a rail body for the second diverging travel configurations including a pair of right and left rail portions 1a for guiding the right and left travel wheels 14 of the travel portion 10 in the second diverging travel configuration may be provided such that the position of each rail body can be changed between a guiding position at which the rail body is in the travel path to guide the article transport vehicle 2 and a retracted position at which the rail body is retracted away from the travel path.

(3) In the first to the third embodiments, examples are described in which the attitude changing portion 28A is provided to the upper guide rail 28 when the article transport vehicle 2 is caused to travel after switching to the non-diverging travel configuration, the first diverging travel configuration, or the second diverging travel configuration while maintaining the proper attitude of the article transport vehicle 2 by means of the movable rail 35 or the upper guide rail 28 in addition to the guide rail 1. However, the attitude changing portion 28A does not have to be provided.

In this case, right and left auxiliary travel wheels may be provided to the travel portion 10 along the vehicle body fore and aft direction in addition to the right and left travel wheels 14 provided to the front and back vehicle bodies such that the right and left auxiliary travel wheels are in contact with the guide rail 1 even if the right and left travel wheels 14 are lifted from the guide rail 1 or the movable rail 35 to stabilize the attitude of the travel portion 10.

(4) In the first to the third embodiments, examples are described in which the two loop-shaped travel paths 4 are provided such that they are adjacent to each other in the path lateral direction and such that they form a double loop. However, three or more loop-shaped travel paths 4 may be provided to form a nested loop with one loop within another.

(5) In the first to the third embodiments, examples are described in which the secondary travel paths 3 which extend by way of or along the article processors P are arranged to the lateral sides of the two loop-shaped travel paths 4. However, one of the plurality of loop-shaped travel paths 4 may extend by way of or along the article processors P.

(6) In the first to the third embodiments, examples are described in which the two loop-shaped travel paths 4 are provided such that they form a double loop with one loop within the other. However, the two loop-shaped travel paths 4 may be configured such that some path portions of the two paths 4 may be positioned close to each other in the path lateral direction while other path portions of the two paths 4 may be located farther away from each other.

What is claimed is:

1. An article transport facility comprising:
a travel guide member provided on a ceiling side for defining travel paths for an article transport vehicle;
wherein the travel guide member defines a plurality of the travel paths along which the article transport vehicle travels in the same direction such that the travel paths are spaced apart from each other in a path lateral direction, and defines a first diverging path and a second diverging path for connecting, with each other, a first travel path that is one of a pair of adjacent travel paths among the plurality of the travel paths and a second travel path that is the other of the pair of the adjacent travel paths,
wherein the first diverging path is a diverging path by means of which the article transport vehicle diverges from the first travel path and travels into the second travel path, wherein the second diverging path is a diverging path by means of which the article transport vehicle diverges from the second travel path and travels into the first travel path, and wherein the first diverging path and the second diverging path are formed such that the first diverging path and the second diverging path extend in directions that are slanted with respect to the first travel path and the second travel path in plan view and such that the first diverging path and the second diverging path intersect each other in plan view.

2. The article transport facility as defined in claim 1, wherein the plurality of the travel paths form a nested loop with one loop within another in plan view.

3. The article transport facility as defined in claim 1 further comprising:

the article transport vehicle including a travel portion and an article holding portion located below the travel portion, wherein the travel portion is provided with right and left travel wheels and right and left guide wheels which are rotated about vertical axes;

wherein the travel guide member includes a pair of right and left rail portions, that are spaced apart from each other in the path lateral direction, for each of the first travel path and the second travel path, wherein the pair of right and left rail portions include travel surfaces on which the travel wheels travel and guide surfaces for guiding the guide wheels, a diverging-side rail portion of the pair of right and left rail portions that is located on a side in which the first diverging path and the second diverging path exist is formed such as to extend along an entrance-side portion and an exit-side portion of the first diverging path or the second diverging path in a diverging path forming area between an entrance portion of the first diverging path or the second diverging path and an exit portion of the second diverging path or the first diverging path, and is also formed such as to be discontinuous in an intersecting area of the first diverging path and the second diverging path;

a travel direction change mechanism for switching a travel state of the article transport vehicle between a diverging travel state in which the article transport vehicle traveling along the first travel path or the second travel path is caused to diverge into the first diverging path or into the second diverging path and a non-diverging travel state in which the article transport vehicle is caused to travel straight forward;

a non-diverging travel auxiliary guiding mechanism for guiding the article transport vehicle to limit the article transport vehicle, that is traveling in the diverging path forming area of the first travel path or the second travel path, from leaning toward a side of the diverging-side rail portion;

an auxiliary support mechanism for receiving and supporting the article transport vehicle in an area in which the diverging-side rail portion does not exit in the first diverging path or the second diverging path; and a diverging travel auxiliary guiding mechanism for guiding the article transport vehicle to limit the article transport vehicle traveling along the first diverging path or the second diverging path from leaning in a lateral direction.

4. The article transport facility as defined in claim 3, wherein a pair of movable rails consisting of a first movable rail and a second movable rail are provided so as to be associated with a first entrance-side rail portion, in the diverging-side rail portion for the first travel path, that extends along the entrance-side portion of the first diverging path, a first exit-side rail portion, in the diverging-side rail portion for the first travel path, that extends along the exit-side portion of the second diverging path, a second entrance-side rail portion, in the diverging-side rail portion for the second travel path, that extends along the entrance-side portion of the second diverging path, and a second exit-side rail portion, in the diverging-side rail portion for the second travel path, that extends along the exit-side portion of the first diverging path, wherein the pair of movable rails are configured such that the arrangement of the pair of movable rails can be switched between a first diverging path forming state in which the first movable rail is in alignment with the first entrance-side rail portion and extends downstream along the first diverging path and in which the second movable rail is in alignment with the second exit-side rail portion and extends upstream along the first diverging path and a second diverging path forming state in which one of the first movable rail and the second movable rail is in alignment with the second entrance-side rail portion and extends downstream along the second diverging path and in which the other of the first movable rail and the second movable rail is in alignment with the first exit-side rail portion and extends upstream along the second diverging path, and wherein the auxiliary support mechanism is configured to receive and support the article transport vehicle with the pair of movable rails.

5. The article transport facility as defined in claim 4, wherein the article transport vehicle includes a guided member for switching paths which is located upwardly of the travel wheels of the travel portion, wherein an upper guide rail for receiving the guided member is provided, wherein the upper guide rail includes a diverging guide surface for achieving the diverging travel state and a non-diverging guide surface for achieving the non-diverging travel state, wherein the travel direction change mechanism is configured to switch the travel state of the article transport vehicle between the diverging travel state and the non-diverging travel state by switching a guided state of the guided member between a state in which the guided member is guided by the diverging guide surface and a state in which the guided member is guided by the non-diverging guide surface, wherein the non-diverging travel auxiliary guiding mechanism is configured to limit the article transport vehicle from leaning toward a side of the diverging-side rail portion by receiving the guided member with the non-diverging guide surface in the diverging path forming area.

6. The article transport facility as defined in claim 5, wherein formed as the diverging guide surface are a first entrance-side diverging guide surface for receiving the guided member to limit the travel portion from leaning toward a side of the travel wheel that is afloat when the travel portion travels with one of the right and left travel wheels being placed on the first entrance-side rail portion and with the other of the right and left travel wheels being afloat, a second exit-side diverging guide surface for receiving the guided member to limit the travel portion from leaning toward a side of the travel wheel that is afloat when the travel portion travels with one of the right and left travel wheels being placed on the second exit-side rail portion and with the other of the right and left travel wheels being afloat, a second entrance-side diverging guide surface for receiving the guided member to limit the travel portion from leaning toward a side of the travel wheel that is afloat when the travel portion travels with one of the right and left travel wheels being placed on the second entrance-side rail portion and with the other of the right and left travel wheels being afloat, and a first exit-side diverging guide surface for receiving the guided member to limit the travel portion from leaning toward a side of the travel wheel that is afloat when the travel portion travels with one of the right and left travel wheels being placed on the first exit-side rail portion and with the other of the right and left travel wheels being afloat, wherein the diverging travel auxiliary guiding mechanism is configured to guide the article transport vehicle such that the guided member is received by the first entrance-side diverging guide surface and the second exit-side diverging guide surface when the article transport vehicle travels along the first diverging path and such that the guided member is received by the second entrance-side diverging guide surface and the first exit-side diverging guide surface when the article transport vehicle travels along the second diverging path.

7. The article transport facility as defined in claim 6, wherein an attitude changing portion which is a part of a portion that defines the diverging guide surface of the upper guide rail is configured to be able to switch a positional arrangement between a first state in which the first entrance-side diverging guide surface and the second exit-side diverging guide surface overlap with each other in a longitudinal direction of the first diverging path and a second state in which the second entrance-side diverging guide surface and the first exit-side diverging guide surface overlap with each other in a longitudinal direction of the second diverging path.

8. The article transport facility as defined in claim 7 further comprising:

a single actuating device operatively connected with the pair of movable rails and with the attitude changing portion;

wherein the actuating device is configured to be able to switch between a first diverging state in which the pair of movable rails are in the first diverging path forming state and in which the attitude changing portion is in the first state and a second diverging state in which the pair of movable rails are in the second diverging path forming state and in which the attitude changing portion is in the second state.

* * * * *